(12) United States Patent
Kojima et al.

(10) Patent No.: US 8,957,402 B2
(45) Date of Patent: Feb. 17, 2015

(54) SEMICONDUCTOR LIGHT EMITTING DEVICE AND MANUFACTURING METHOD OF THE SAME

(75) Inventors: Akihiro Kojima, Kanagawa-ken (JP);
Hideto Furuyama, Kanagawa-ken (JP);
Miyoko Shimada, Kanagawa-ken (JP);
Yosuke Akimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/597,096

(22) Filed: Aug. 28, 2012

(65) Prior Publication Data
US 2013/0285011 A1 Oct. 31, 2013

(30) Foreign Application Priority Data
Apr. 27, 2012 (JP) ................... 2012-103031

(51) Int. Cl.
*H01L 29/06* (2006.01)
(52) U.S. Cl.
USPC ......... 257/13; 257/628; 257/85; 257/E33.016
(58) Field of Classification Search
USPC .............................. 257/13, 628, 85, E33.016
See application file for complete search history.

(56) References Cited

U.S. PATENT DOCUMENTS

| 8,110,421 | B2 | 2/2012 | Sugizaki et al. | |
|---|---|---|---|---|
| 2002/0022288 | A1* | 2/2002 | Hayashi et al. | 438/47 |
| 2002/0145148 | A1* | 10/2002 | Okuyama et al. | 257/88 |
| 2010/0148198 | A1* | 6/2010 | Sugizaki et al. | 257/98 |
| 2012/0097972 | A1 | 4/2012 | Sugizaki et al. | |

FOREIGN PATENT DOCUMENTS

| JP | 11-168236 | 6/1999 |
|---|---|---|
| JP | 2008-159338 | 7/2008 |
| JP | 2009-021642 | 1/2009 |
| JP | 2010-050487 | 3/2010 |
| JP | 2010-097883 | 4/2010 |
| TW | 201031033 A | 8/2010 |

OTHER PUBLICATIONS

Taiwanese Office Action dated Aug. 14, 2014, filed in Taiwan counterpart Application No. 101147847, 13 pages (with translation).

\* cited by examiner

*Primary Examiner* — Dale E Page
(74) *Attorney, Agent, or Firm* — Patterson & Sheridan, LLP

(57) ABSTRACT

According to one embodiment, a semiconductor light emitting device includes a first nitride semiconductor layer, a nitride semiconductor light emitting layer, a second nitride semiconductor layer, a p-side electrode, and an n-side electrode. The nitride semiconductor light emitting layer is provided on the p-side region of the second face of the first nitride semiconductor layer. The second nitride semiconductor layer is provided on the nitride semiconductor light emitting layer. The p-side electrode is provided on the second nitride semiconductor layer. The n-side electrode is provided on the n-side region of the second face of the first nitride semiconductor layer. The nitride semiconductor light emitting layer has a first concave-convex face in a side of the first nitride semiconductor layer, and a second concave-convex face in a side of the second nitride semiconductor layer.

9 Claims, 24 Drawing Sheets

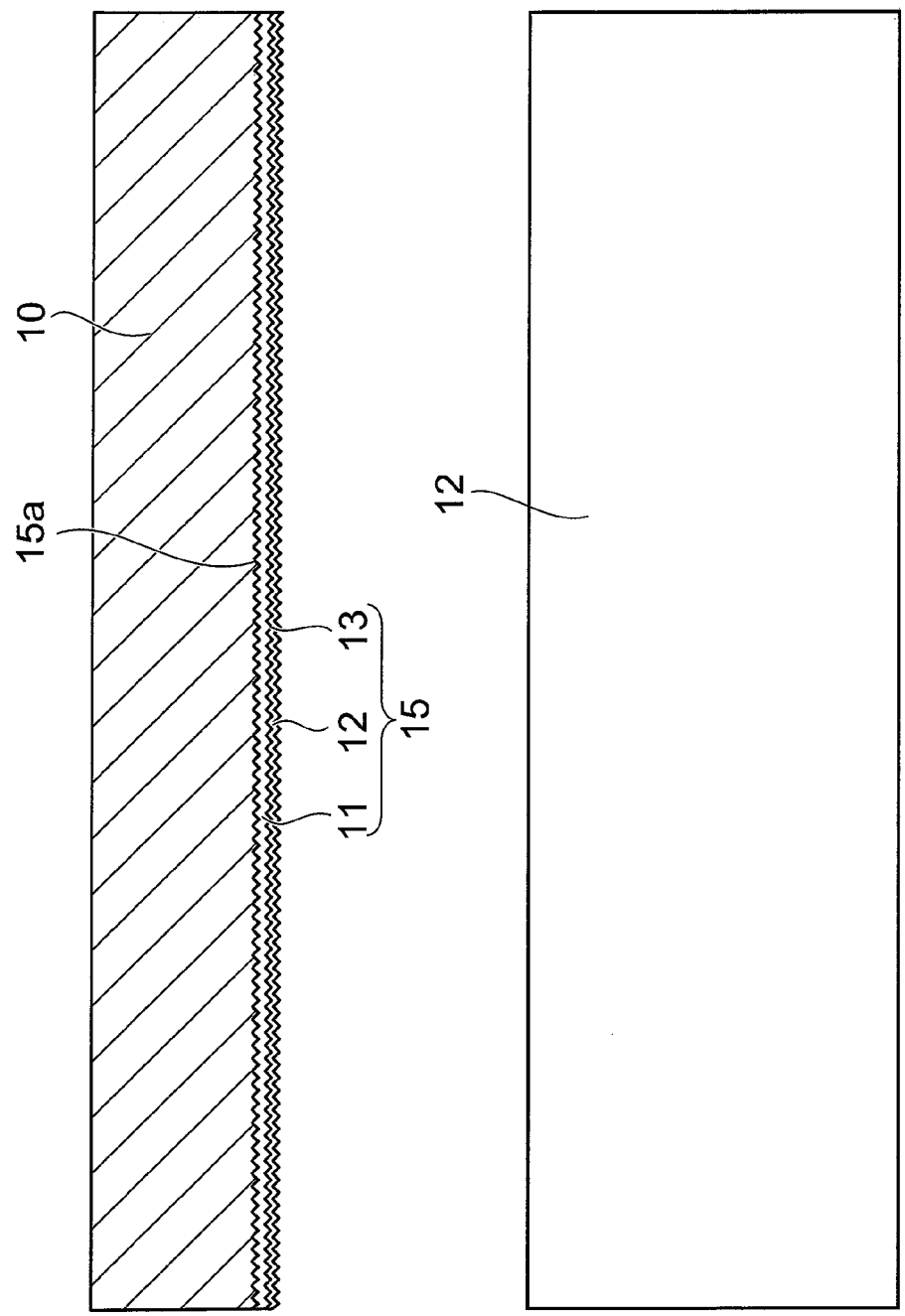

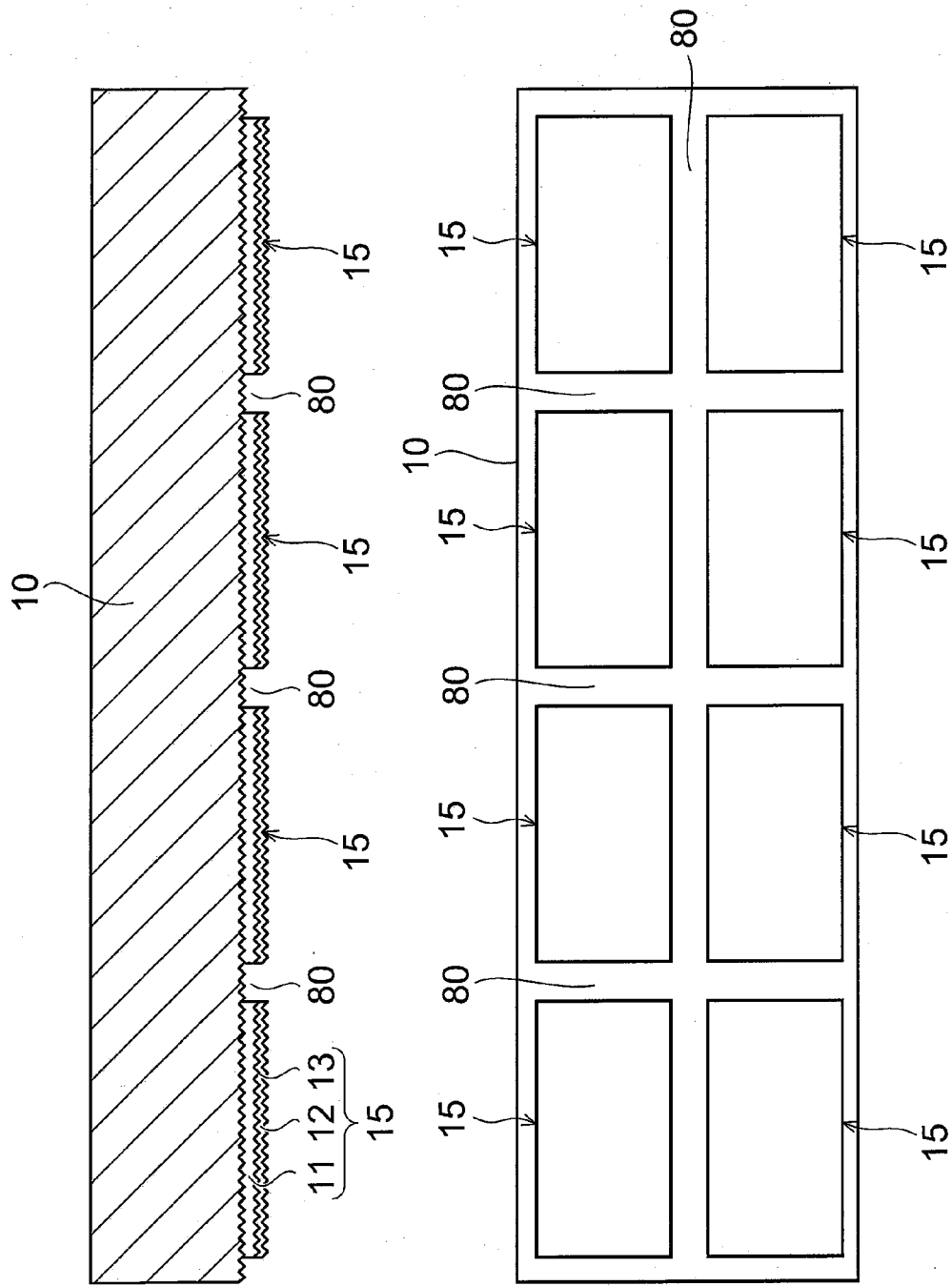

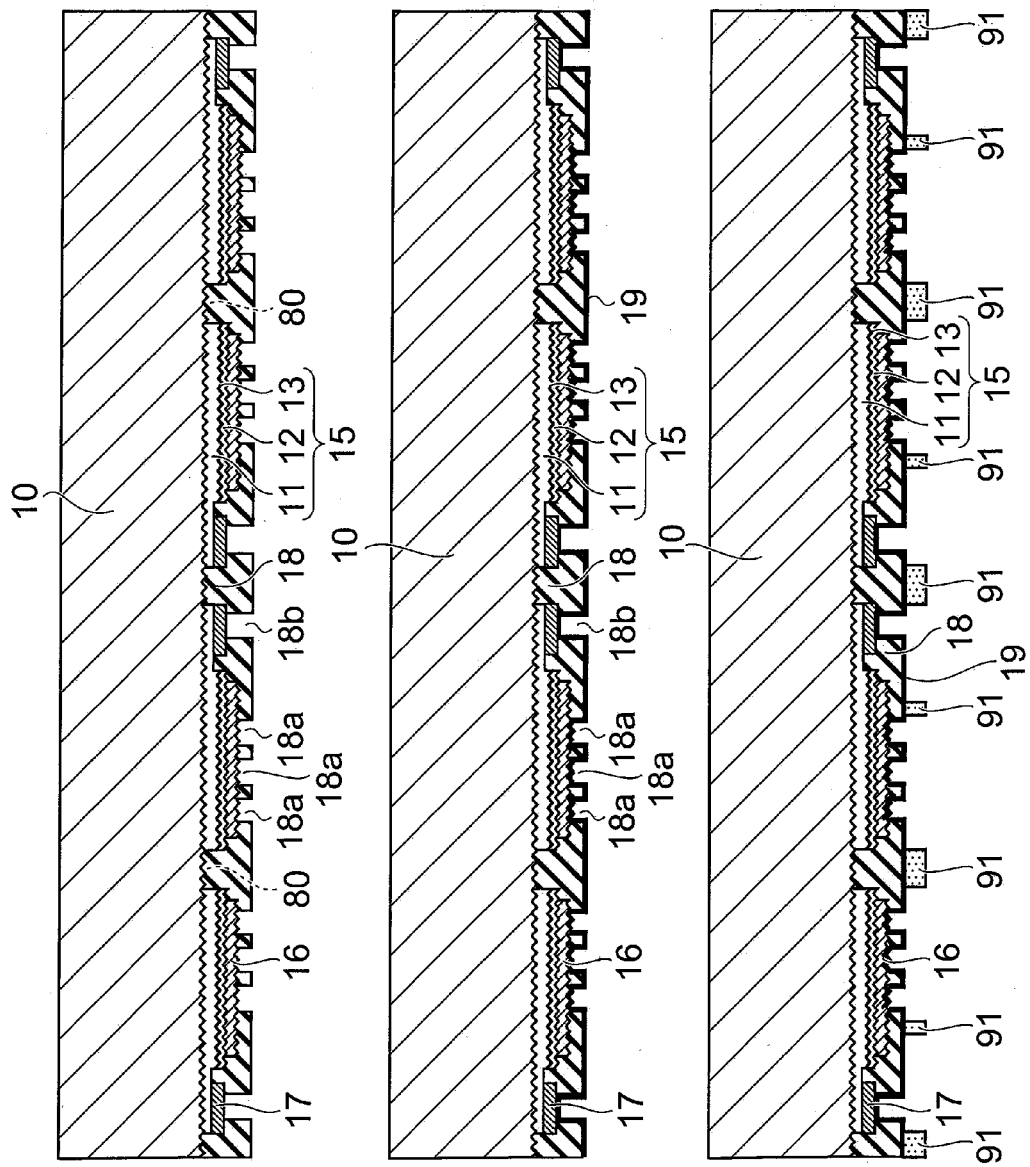

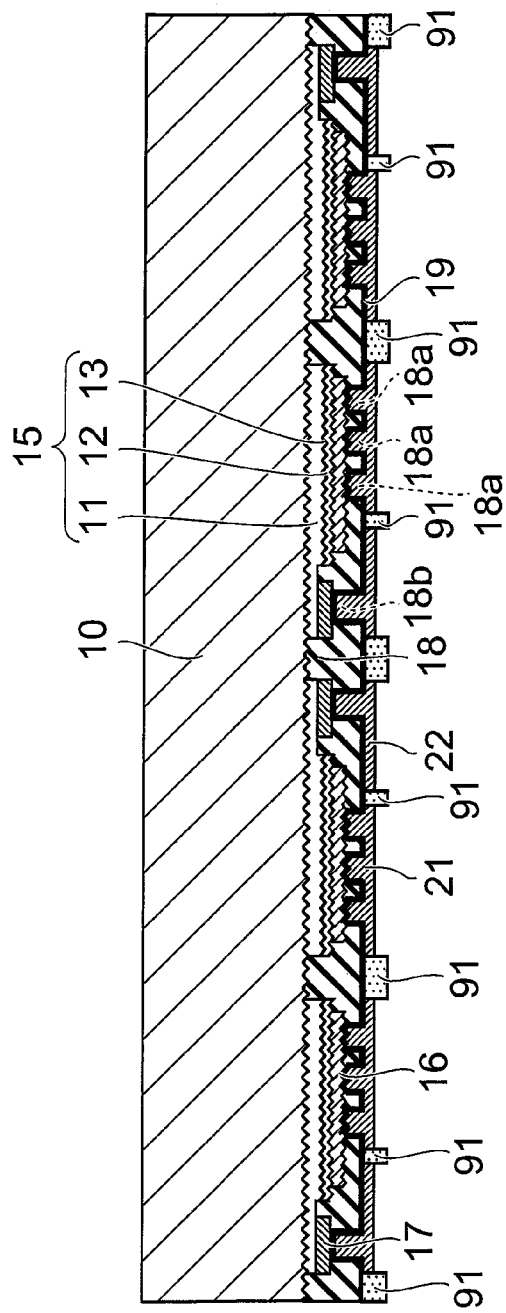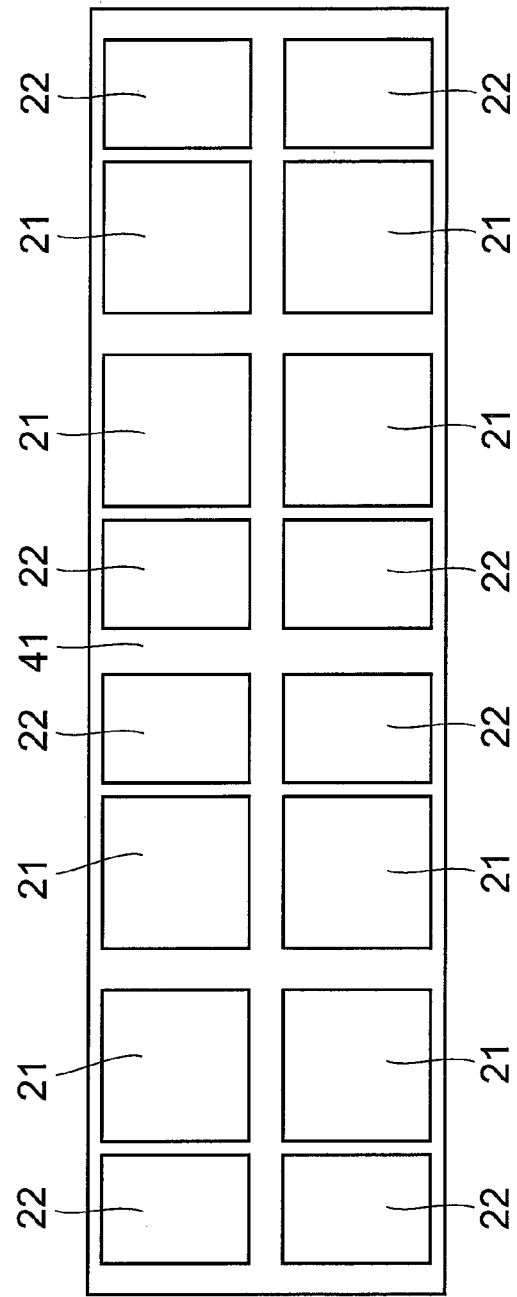
FIG. 10A
FIG. 10B

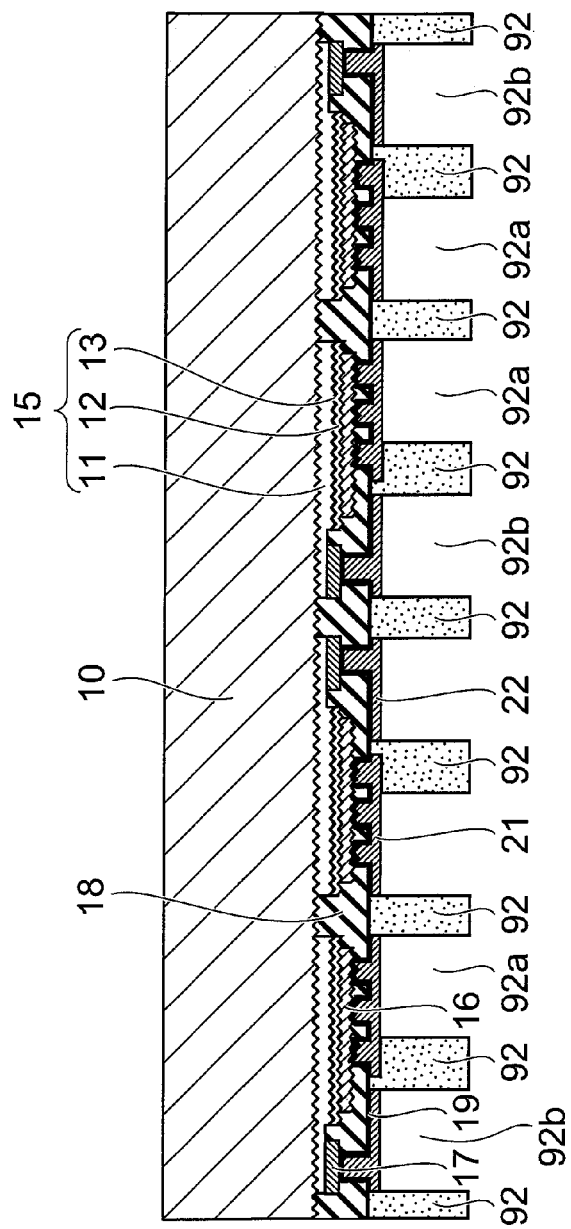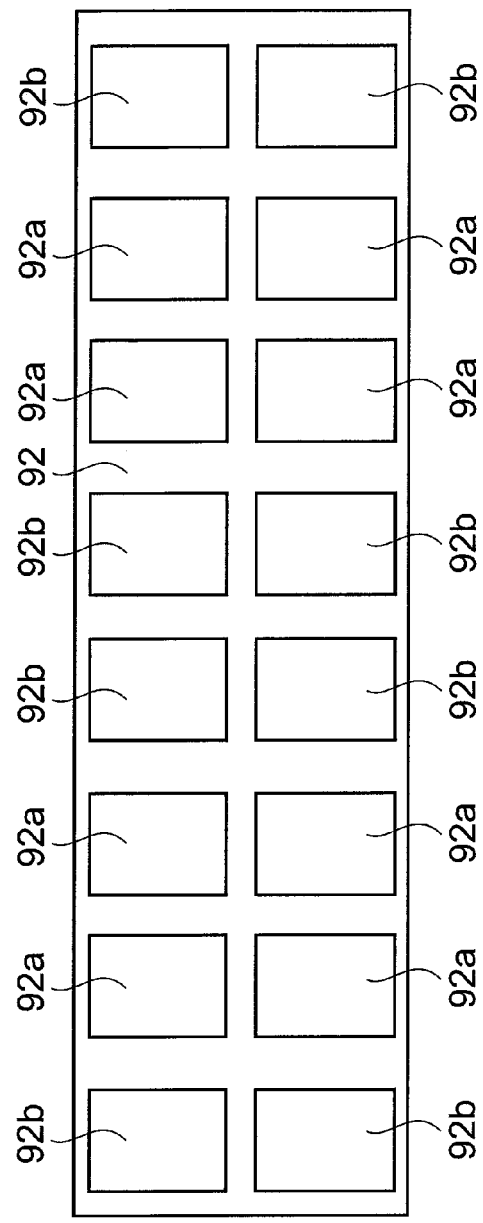
FIG. 11A
FIG. 11B

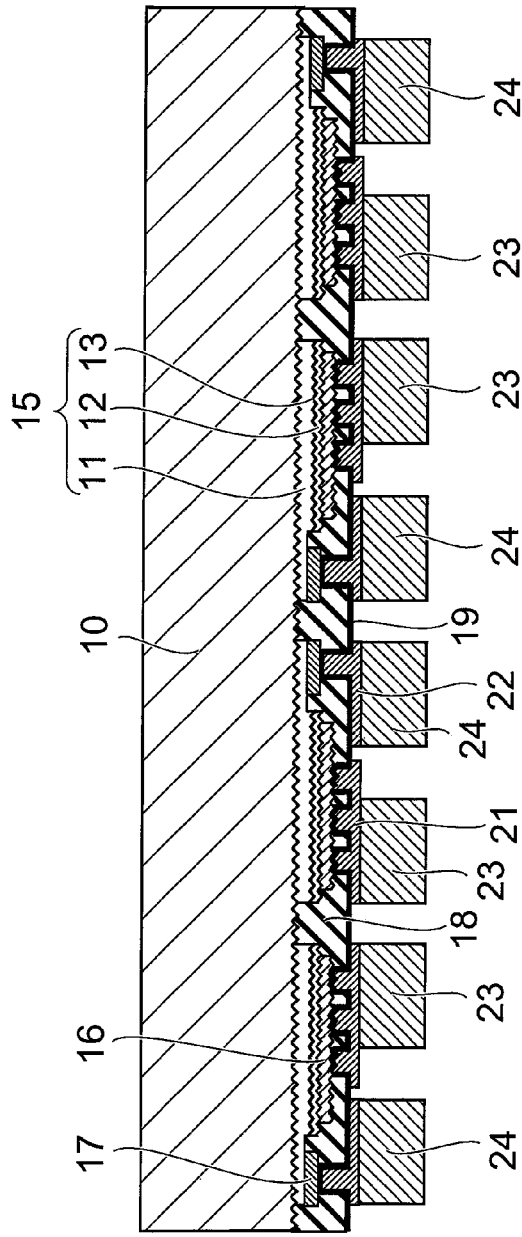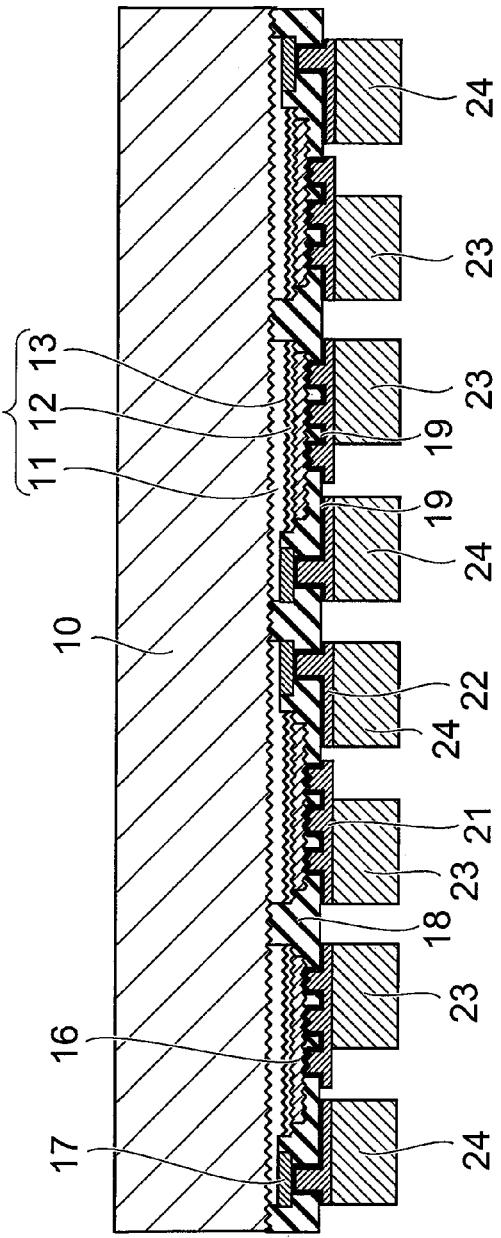
FIG. 13A
FIG. 13B

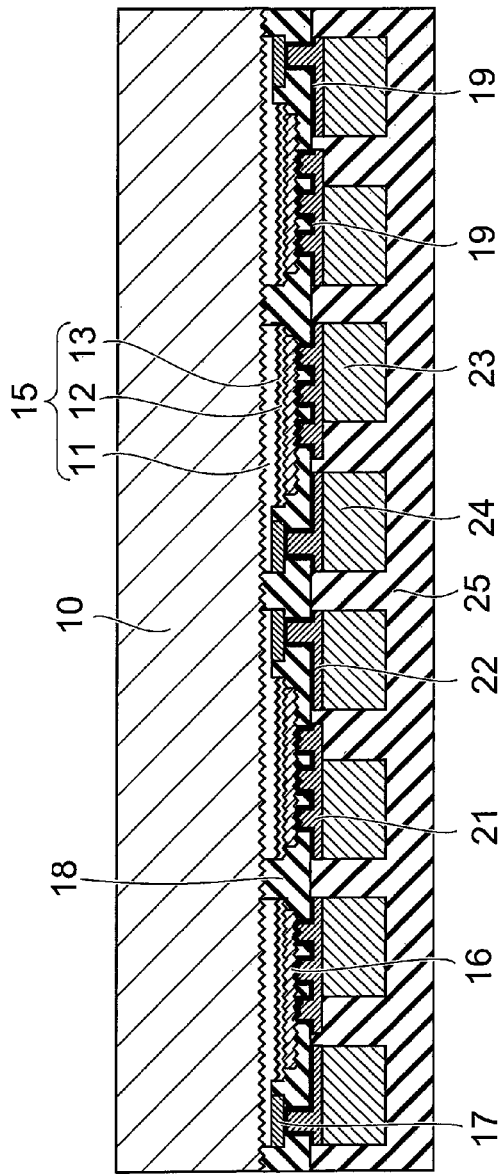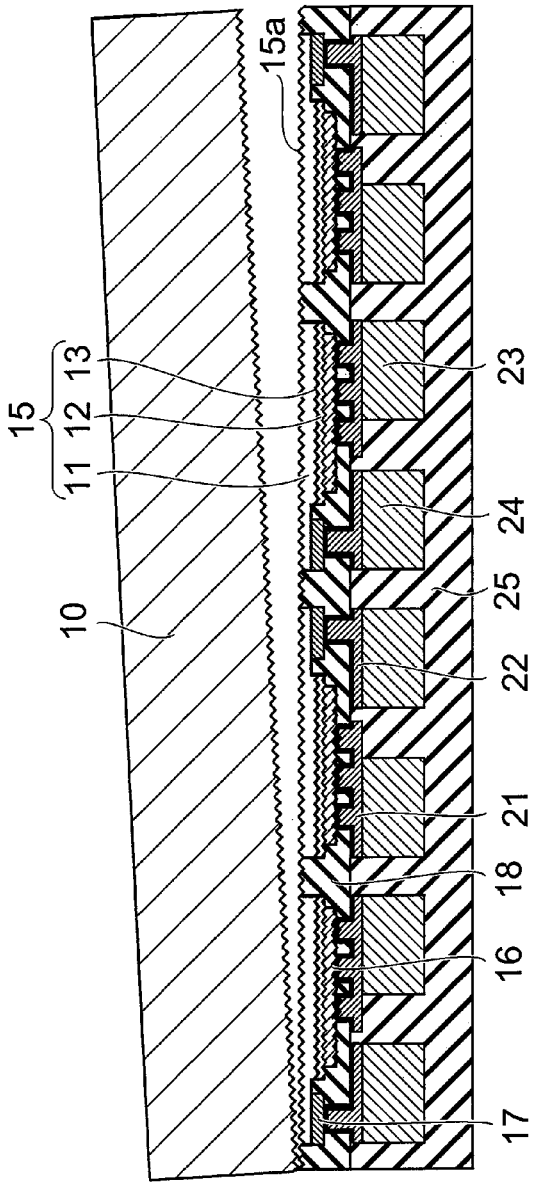

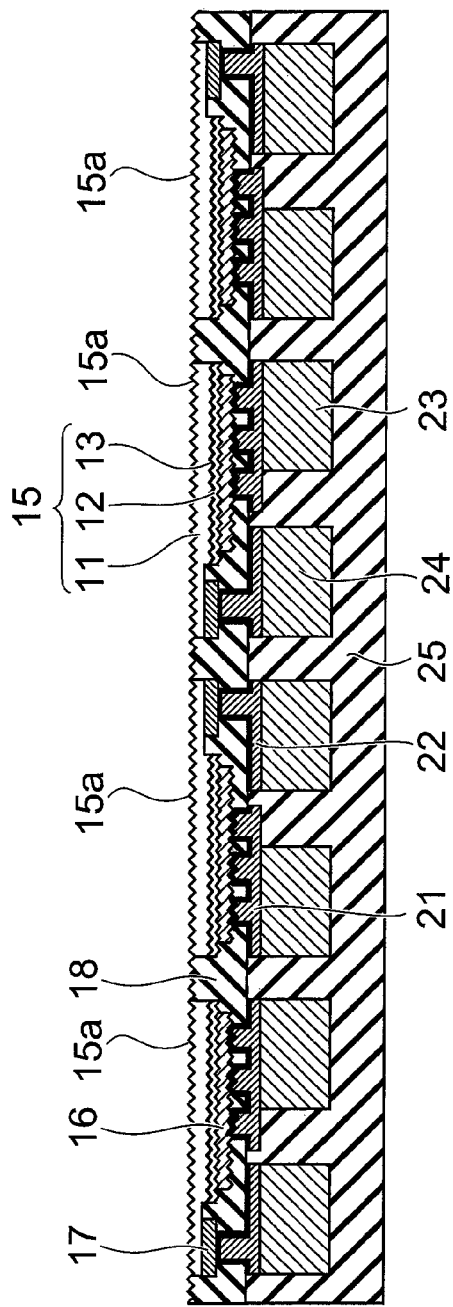
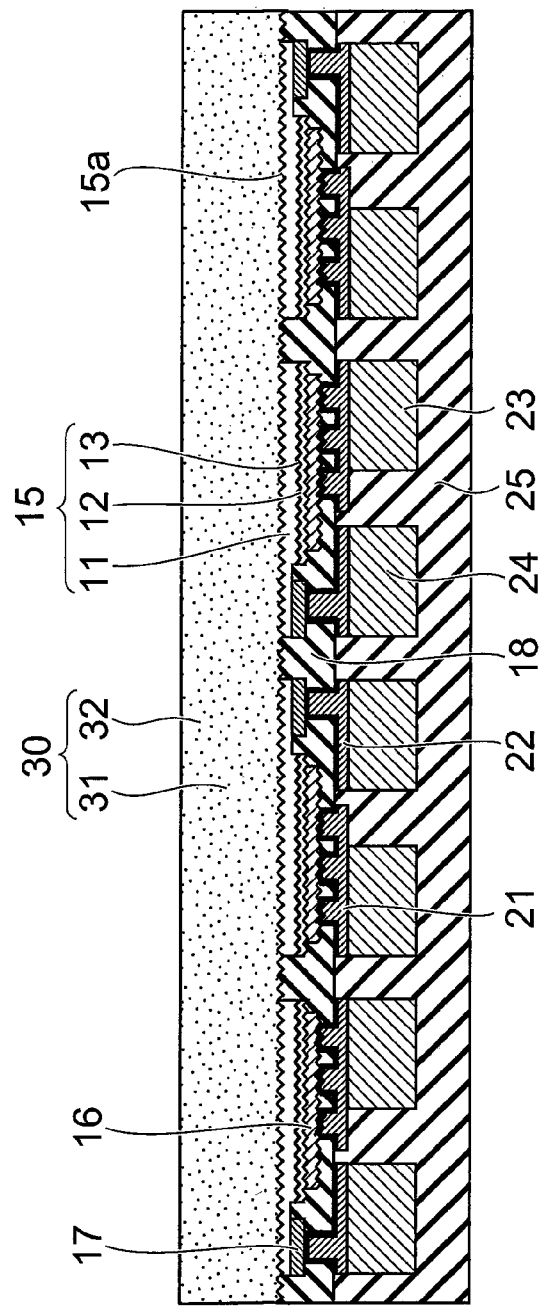
FIG. 15A
FIG. 15B

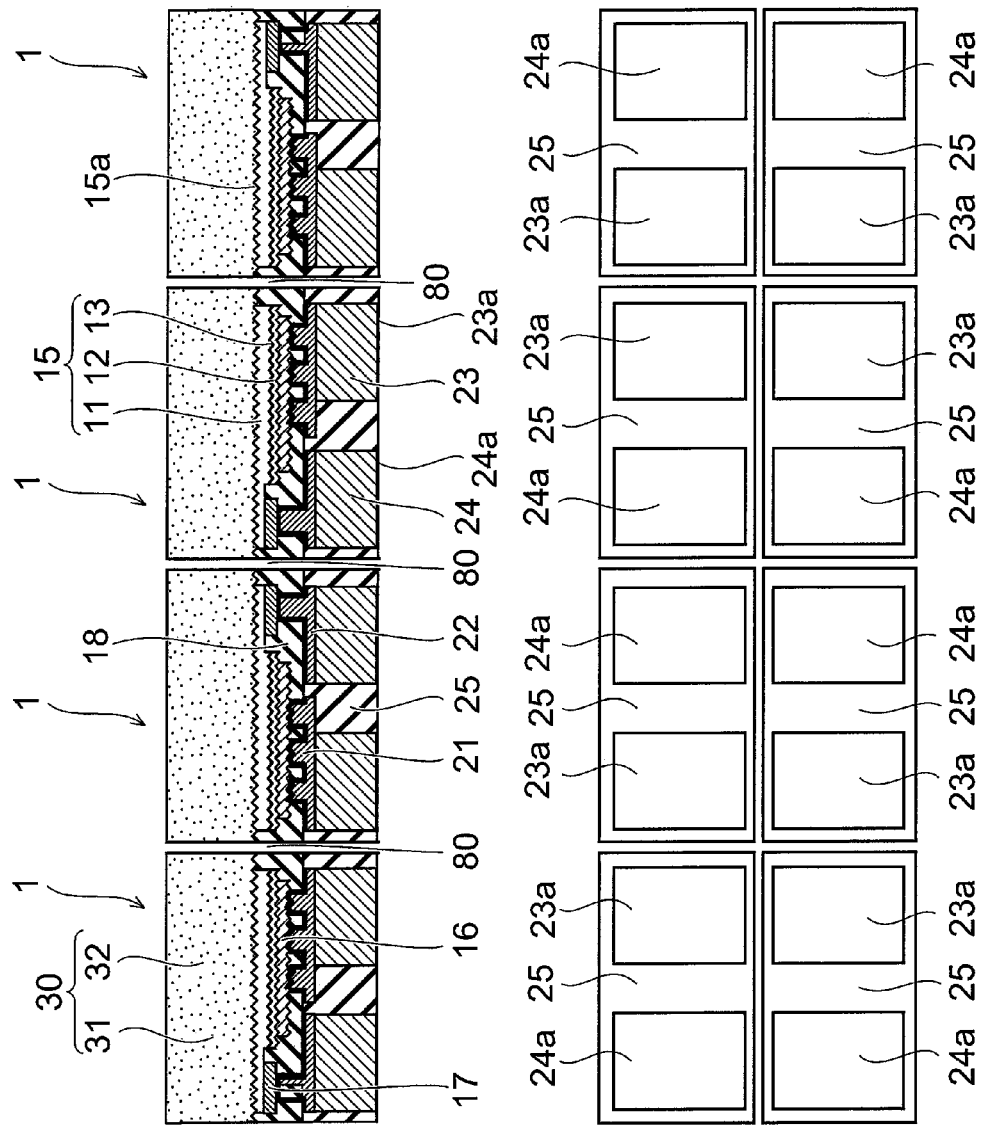

SEMICONDUCTOR LIGHT EMITTING DEVICE AND MANUFACTURING METHOD OF THE SAME

CROSS-REFERENCE TO RELATED APPLICATION

This application is based upon and claims the benefit of priority from Japanese Patent Application No. 2012-103031, filed on Apr. 27, 2012; the entire contents of which are incorporated herein by reference.

FIELD

Embodiments described herein relate generally to a semiconductor light emitting device and a manufacturing method of the same.

BACKGROUND

In a light emitting diode (LED), a downsizing of a chip size and an enlargement of a light emitting area are in a trade-off-relationship, and the light emitting area becomes smaller as the downsizing of the chip size makes progress.

BRIEF DESCRIPTION OF THE DRAWINGS

FIGS. 3A to 16B are schematic views showing a method for manufacturing the light emitting device of the embodiment;

DETAILED DESCRIPTION

Figure 1:
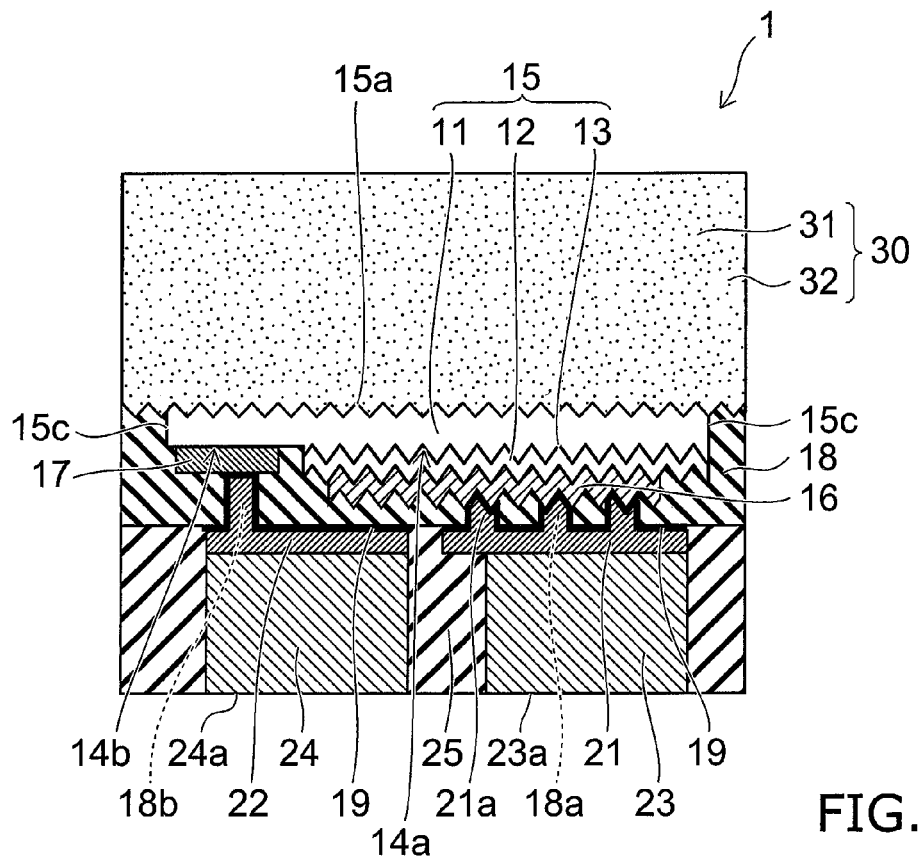
FIG. 1 is a schematic cross-sectional view of a light emitting device of an embodiment.

According to one embodiment, a semiconductor light emitting device includes a first nitride semiconductor layer, a nitride semiconductor light emitting layer, a second nitride semiconductor layer, a p-side electrode, and an n-side electrode. The first nitride semiconductor layer has a first face and a second face opposite to the first face. The second face has a p-side region and an n-side region. The nitride semiconductor light emitting layer is provided on the p-side region of the second face of the first nitride semiconductor layer. The second nitride semiconductor layer is provided on the nitride semiconductor light emitting layer. The p-side electrode is provided on the second nitride semiconductor layer. The n-side electrode is provided on the n-side region of the second face of the first nitride semiconductor layer. The nitride semiconductor light emitting layer has a first concave-convex face in a side of the first nitride semiconductor layer, and a second concave-convex face in a side of the second nitride semiconductor layer.

A description will be given below of an embodiment with reference to the accompanying drawings. In this case, in each of the drawings, the same reference numerals are denoted to the same elements.

FIG. 1 is a schematic cross sectional view of a semiconductor light emitting device 1 according to an embodiment.

Figure 2:
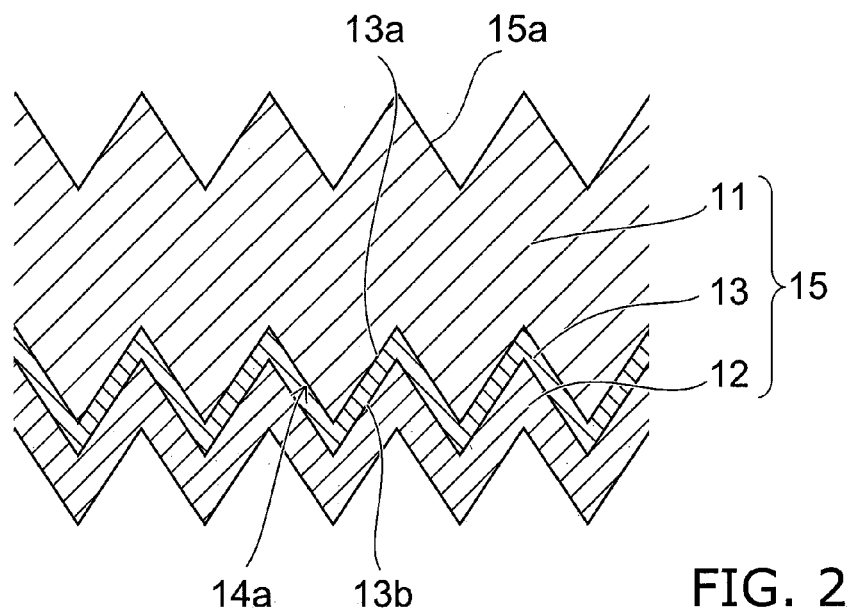
FIG. 2 is a schematic enlarged cross sectional view of a semiconductor layer in FIG. 1.

FIG. 2 is a schematic enlarged cross sectional view of a semiconductor layer 15 in the semiconductor light emitting device 1.

The semiconductor light emitting device 1 has a semiconductor layer 15. The semiconductor layer 15 includes a first semiconductor layer 11, a second semiconductor layer 12, and a light emitting layer 13. The first semiconductor layer 11, the second semiconductor layer 12 and the light emitting layer 13 are all configured by a nitride semiconductor expressed by $In_xAl_yGa_{1-x-y}N$ ($0 \leq x \leq 1$, $0 \leq y \leq 1$, $x+y \leq 1$). In this case, it is assumed that a material including an impurity which is added to control a conductive type is also included in "nitride semiconductor".

The first semiconductor layer 11 has a first face 15a, and a second face which is provided in an opposite side to the first face 15a. Further, the second face has a p-side region 14a and an n-side region 14b. The first semiconductor layer 11 includes, for example, a foundation buffer layer, and an n-type GaN layer.

A light emitting layer (an active layer) 13 is provided on the p-side region 14a in the second face of the first semiconductor layer 11. The light emitting layer 13 has, for example, an InGaN group multiple quantum well configuration obtained by stacking plural pairs of an InGaN well layer and a GaN or an InGaN barrier layer, and emits a blue light, a violet light, a lavender light, an ultraviolet light or the like.

A second semiconductor layer 12 including a p-type GaN layer is provided on the light emitting layer 13. The light emitting layer 13 and the second semiconductor layer 12 are not provided in the n-side region 14b in the second face of the first semiconductor layer 11. In other words, the second face of the first semiconductor layer 11 has the p-side region 14a which is provided with the light emitting layer 13 and the second semiconductor layer 12, and the n-side region 14b which is not provided with the light emitting layer 13 or the second semiconductor layer 12, but to which the first semiconductor layer 11 is exposed.

In a plan view in which the second face of the first semiconductor layer 11 is seen, a plane area of the p-side region 14a is wider than a plan area of the n-side region 14b, and a plane area of the light emitting layer 13 is wider than the plane area of the n-side region 14b. The "plane area" in this case is not a surface area, but is an area on a plane facing the second face of the first semiconductor layer 11.

The first face 15a of the first semiconductor layer 11 serves as a main pickup face of the light, and the light emitting light of the light emitting layer 13 is mainly emitted to an outer portion of the semiconductor layer 15 from the first face 15a. A p-side electrode 16, an n-side electrode 17 and a support body mentioned later are provided in an opposite side to the first face 15a.

The first face 15a of the first semiconductor layer 11 is a concave-convex face. Also, the p-side region 14a in the second face of the first semiconductor layer 11 is a concave-convex face. The n-side region 14b in the second face is a flat face in an illustration, and may be a concave-convex face.

As shown in FIG. 2, the light emitting layer 13 is provided in a conformal manner along the concave-convex face in the p-side region 14a in the second face of the first semiconductor layer 11. Accordingly, the light emitting layer 13 has a first concave-convex face 13a in a side of the first semiconductor layer 11, and a second concave-convex face 13b in a side of the second semiconductor layer 12. The second semiconductor layer 12 is provided in a conformal manner along the second concave-convex face 13b of the light emitting layer 13.

The first concave-convex face 13a and the second concave-convex face 13b of the light emitting layer 13 have a plurality of concave portions and a plurality of convex portions. One concave portion is formed as a concave shape, for example, having four triangular side faces of a square cone as side walls.

A repeating cycle of a plurality of concave portions and convex portions in the first concave-convex face 13a and the second concave-convex face 13b is, for example, between 1.4 and 2.1 (μm). A depth of the concave portion (a height of the convex portion) in the first concave-convex face 13a and the second concave-convex face 13b is, for example, between 1.0 and 1.5 (μm).

A p-side electrode 16 is provided on the second semiconductor layer 12. The p-side electrode 16 comes into ohmic contact with the second semiconductor layer 12. An n-side electrode 17 is provided in the n-side region 14b in the second surface of the first semiconductor layer 11. The n-side electrode 17 comes into ohmic contact with the first semiconductor layer 11.

The p-side electrode 16 and the n-side electrode 17 are provided on the same face side in an opposite side to the first face 15a which corresponds to a main light pickup face in the semiconductor layer 15, the p-side electrode 16 is provided on a region which includes the light emitting layer 13, and the n-side electrode 17 is provided on a region which does not include the light emitting layer 13.

The second semiconductor layer 12 is formed in a conformal manner along the concave-convex shape of the light emitting layer 13. Accordingly, a face in an opposite side to the light emitting layer 13 in the second semiconductor layer 12 is a concave-convex face, and a contact face between the second semiconductor layer 12 and the p-side electrode 16 is an concave-convex face.

The n-side region 14b in the second face of the first semiconductor layer 11 is formed such that the face of the first semiconductor layer 11 is exposed, by selectively removing the light emitting layer 13 which is formed on a whole face of the second face of the first semiconductor layer 11, and a part of the second semiconductor layer 12, as mentioned later. The n-side region 14b may be a case that it is a concave-convex face, or a case that it is a flat face. Accordingly, the contact face between the first semiconductor layer 11 and the n-side electrode 17 may be a concave-convex face or a flat face.

Figures 8A, 8B:
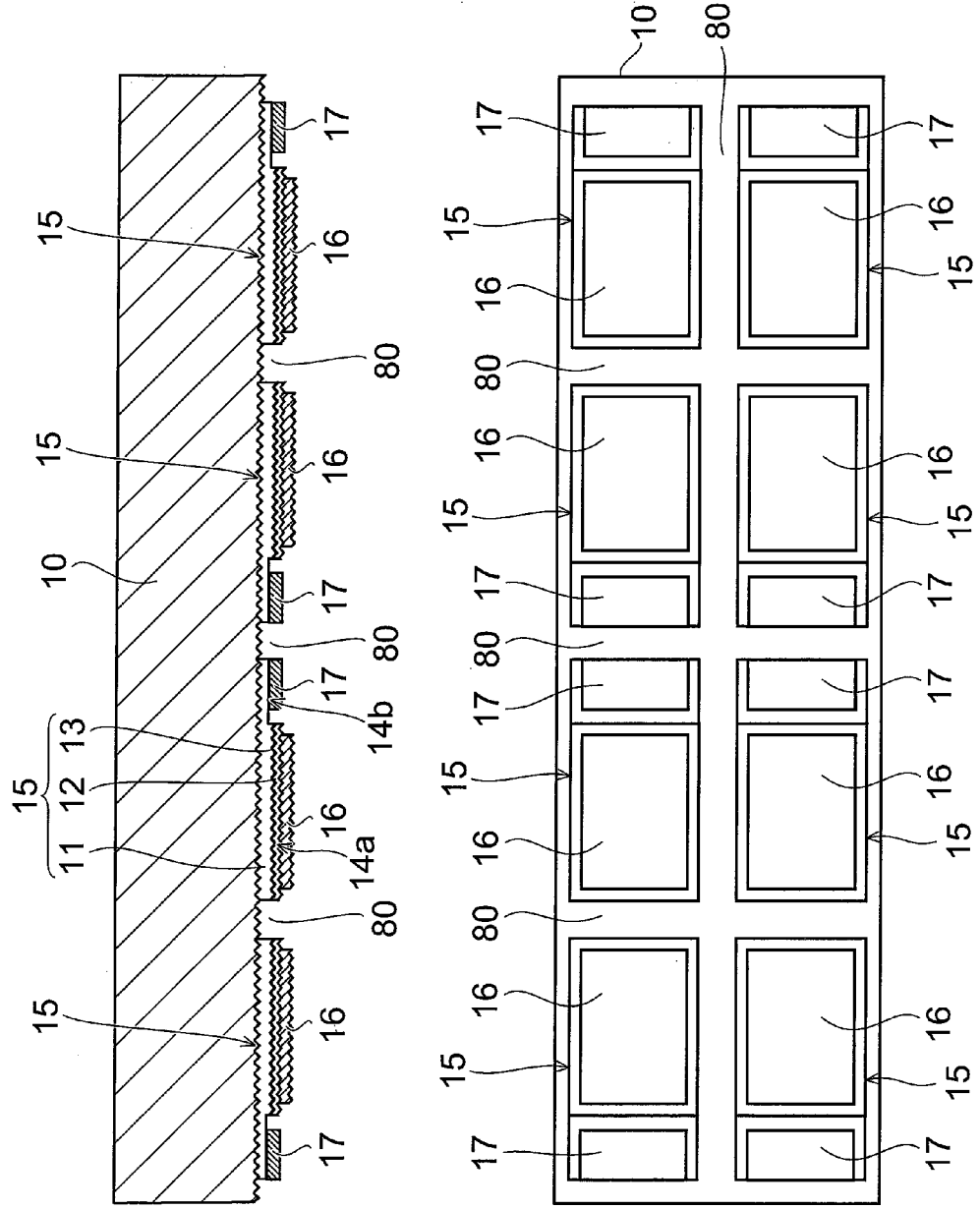

FIG. 8B illustrates a plan view of a face on which is provided with the p-side electrode 16 and the n-side electrode 17, and an area of the p-side electrode 16 is wider than an area of the n-side electrode 17 on the plan view. In this case, a layout of the p-side electrode 16 and the n-side electrode 17 shown in FIG. 8B is an example, and is not limited to this.

A first insulating film (hereinafter, refer simply to as an insulating film) 18 is provided on the faces other than the first face 15a in the semiconductor layer 15. The insulating film 18 covers the n-side region 14b of the first semiconductor layer 11, the face of the second semiconductor layer 12, the side face of the second semiconductor layer 12, the side face of the light emitting layer 13, the p-side electrode 16 and the n-side electrode 17.

In this case, another insulating film (for example, a silicon oxide film) may be provided between the insulating film 18 and the semiconductor layer 15. The insulating film 18 is a resin, for example, a polyimide or the like which is excellent in a patterning property of a fine opening. Alternatively, an inorganic film such as a silicon oxide film, a silicon nitride film or the like may be used as the insulating film 18.

The insulating film 18 is not provided on the first face 15a of the semiconductor layer 15. The insulating film 18 covers and protects the side face 15c which comes from the first face 15a in the first semiconductor layer 11.

A p-side interconnection layer 21 and an n-side interconnection layer 22 are provided on a surface in an opposite side to the semiconductor layer 15 so as to be spaced from each other.

The p-side interconnection layer 21 is provided within a plurality of first openings 18a which reach the p-side electrode 16 and are formed in the insulating film 18, and is electrically connected to the p-side electrode 16. The n-side interconnection layer 22 is formed within a second opening 18b which reaches the n-side electrode 17 and is formed in the insulating film 18, and is electrically connected to the n-side electrode 17.

A p-side metal pillar 23 is provided in a face in an opposite side to the p-side electrode 16 in the p-side interconnection layer 21. The p-side interconnection layer 21, the p-side metal pillar 23 and the metal film 19 which is used as a seed layer mentioned later configure the p-side interconnection portion in the embodiment.

An n-side metal pillar 24 is provided in a face in an opposite side to the n-side electrode 17 in the n-side interconnection layer 22. The n-side interconnection layer 22, the n-side metal pillar 24, and the metal film 19 which is used as the seed layer mentioned later configure the n-side interconnection portion in the embodiment.

For example, a resin layer 25 is stacked as a second insulating film on the insulating film 18. The resin layer 25 covers a periphery of the p-side interconnection portion and a periphery of the n-side interconnection portion. Further, the resin layer 25 is filled between the p-side metal pillar 23 and the n-side metal pillar 24.

The side face of the p-side metal pillar 23 and the side face of the n-side metal pillar 24 are covered by the resin layer 25. A face in an opposite side to the p-side interconnection layer 21 in the p-side metal pillar 23 is exposed from the resin layer 25, and serves as a p-side outer terminal 23a. A face in an opposite side to the n-side interconnection layer 22 in the n-side metal pillar 24 is exposed from the resin layer 25 and serves as an n-side outer terminal 24a.

The p-side outer terminal 23a and the n-side outer terminal 24a are bonded to a pad which is formed in a mounting substrate, via a bonding material such as a solder, the other metals, a conductive material or the like.

A distance between the p-side outer terminal 23a and the n-side outer terminal 24a which are exposed on the same face (the lower face in FIG. 1) in the resin layer 25 is larger than a distance between the p-side interconnection layer 21 and the n-side interconnection layer 22 on the insulating film 18. The p-side outer terminal 23a and the n-side outer terminal 24a are spaced at a distance at which they are not short circuited with each other by the solder or the like at a time of being mounted to the mounting substrate.

The p-side interconnection layer 21 can be moved close to the n-side interconnection layer 22 to a critical limit on a process, and it is possible to widen an area of the p-side interconnection layer 21. As a result, it is possible to achieve an enlargement of a contact face between the p-side interconnection layer 21 and the p-side electrode 16, and it is possible to improve a current distribution and a heat radiating property.

An area by which the p-side interconnection layer 21 comes into contact with the p-side electrode 16 through a plurality of first openings 18a is larger than an area by which the n-side interconnection layer 22 comes into contact with the n-side electrode 17 through the second opening 18b. Accordingly, a current distribution to the light emitting layer 13 is improved, and a heat radiating property of the light emitting layer 13 can be improved.

An area of the n-side interconnection layer 22 expanding on the insulating film 18 is larger than an area by which the n-side interconnection layer 22 comes into contact with the n-side electrode 17.

In accordance with the embodiment, it is possible to obtain a high light output by the light emitting layer 13 which is formed over a wider region than the n-side electrode 17. In this case, the n-side electrode 17 which is provided in a narrower region than the region which includes the light emitting layer 13 is drawn out as the n-side interconnection layer 22 having a greater area to the mounting face side.

The first semiconductor layer 11 is electrically connected to the n-side metal pillar 24 which has the n-side outer terminal 24a, via the n-side electrode 17, the metal film 19 and the n-side interconnection layer 22. The second semiconductor layer 12 is electrically connected to the p-side metal pillar 23 which has the p-side outer terminal 23a, via the p-side electrode 16, the metal film 19 and the p-side interconnection layer 21.

The p-side metal pillar 23 is thicker than the p-side interconnection layer 21, and the n-side metal pillar 24 is thicker than the n-side interconnection layer 22. A thickness of each of the p-side metal pillar 23, the n-side metal pillar 24 and the resin layer 25 is thicker than the semiconductor layer 15. In this case, "thickness" in this case refers to a thickness in a vertical direction in FIG. 1.

Further, a thickness of each of the p-side metal pillar 23 and the n-side metal pillar 24 is thicker than a thickness of a stacked body which includes the semiconductor layer 15, the p-side electrode 16, the n-side electrode 17 and the insulating film 18. In this case, an aspect ratio (a ratio of a thickness with respect to a plane size) of each of the metal pillars 23 and 24 is not limited to be not Tess than 1, but also may be smaller than 1. In other words, the metal pillars 23 and 24 may be configured such that the thickness is smaller than the plane size.

In accordance with the embodiment, even if the substrate 10 which is used for forming the semiconductor layer 15 and is mentioned later is removed, it is possible to stably support the semiconductor layer 15 by a support body which includes the p-side metal pillar 23, the n-side metal pillar 24 and the resin layer 25, and it is possible to enhance a mechanical strength of the semiconductor light emitting device 1.

As the material of the p-side interconnection layer 21, the n-side interconnection layer 22, the p-side metal pillar 23 and the n-side metal pillar 24, a copper, a gold, a nickel, a silver and the like can be used. Among them, if the copper is used, it is possible to obtain a good heat conductivity, a high migration resistance and an excellent adhesion to the insulating material.

The resin layer 25 reinforces the p-side metal pillar 23 and the n-side metal pillar 24. It is desirable that the resin layer 25 employs a configuration in which a coefficient of thermal expansion is the same as or similar to the mounting substrate.

As the resin layer 25 mentioned above, there can be listed up, for example, an epoxy resin, a silicone resin, a fluorocarbon resin and the like.

Further, in a state in which the semiconductor light emitting device 1 is mounted to the mounting substrate via the p-side outer terminal 23a and the n-side outer terminal 24a, it is possible to reduce a stress which is applied to the semiconductor layer 15 via the solder or the like, by allowing the p-side metal pillar 23 and the n-side metal pillar 24 to absorb the stress.

The p-side interconnection portion which includes the p-side interconnection layer 21 and the p-side metal pillar 23 is connected to the p-side electrode 16 via a plurality of vias 21a which are provided within a plurality of first openings 18a and are segmented from each other. Accordingly, a high stress reducing effect by the p-side interconnection portion can be obtained.

Figure 19A:
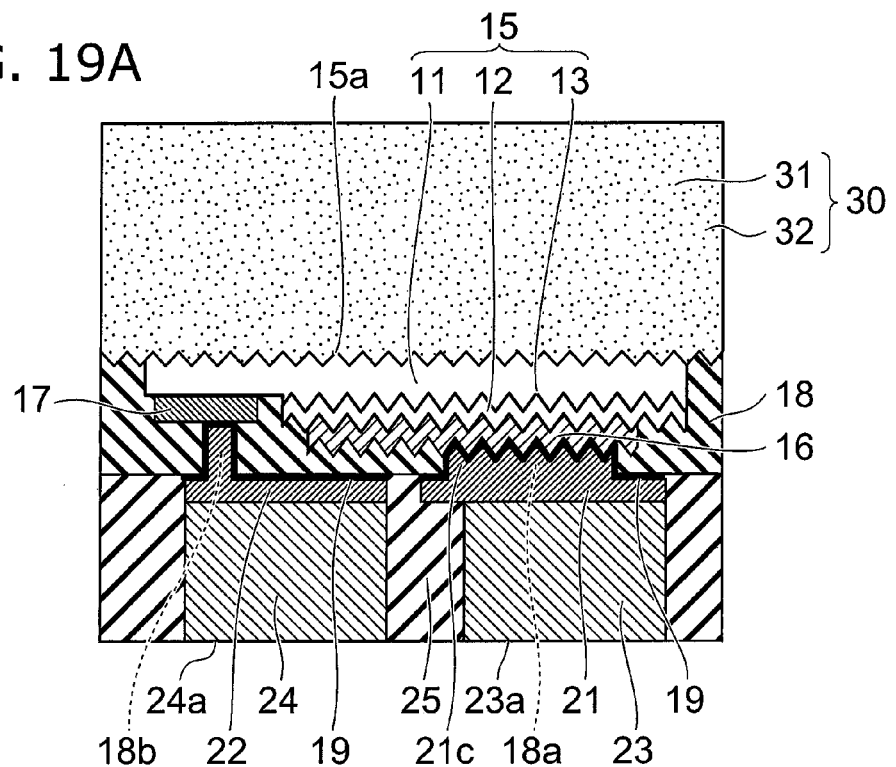
FIGS. 19A and 19B are schematic cross-sectional views of a light emitting device of another specific example of the embodiment.

Alternatively, as shown in FIG. 19A, the p-side interconnection layer 21 may be connected to the p-side electrode 16 via a post 21c which is provided within one large first opening 18a and is larger in a plane size than the via 21a. In this case, it is possible to achieve an improvement of a heat radiating property of the light emitting layer 13 through the p-side electrode 16, the p-side interconnection layer 21 and the p-side metal pillar 23 which are all made of metal.

As mentioned later, the substrate 10 which is used at a time of forming the semiconductor layer 15 is removed from the first face 15a. Accordingly, it is possible to make a back of the semiconductor light emitting device 1 low.

A phosphor layer 30 is provided on the first face 15a. The phosphor layer 30 has a transparent resin 31, and a plurality of granular phosphor 32 which are dispersed into the transparent resin 31.

The transparent resin 31 has a permeability with respect to the light emitting light of the light emitting layer 13 and the light emitting light of the phosphor 32, and can employ, for example, a silicone resin, an acrylic resin, a phenyl resin or the like.

The phosphor 32 can absorb the light emitting light (the excited light) of the light emitting layer 13, and emit a wavelength converting light. Accordingly, the semiconductor light emitting device 1 can emit a mixed light of the light emitting light of the light emitting layer 13 and the wavelength converting light of the phosphor 32.

For example, if the phosphor 32 is a yellow phosphor which emits a yellow light, it is possible to obtain a white color or an electric lamp color as a mixed color of a blue color of the light emitting layer 13 serving as an InGaN material, and a yellow light serving as the wavelength converting light in the phosphor 32. In this case, the phosphor layer 30 may be configured such as to include plural kinds of phosphors (for example, a red phosphor which emits a red light, and a green phosphor which emits a green light).

In accordance with the embodiment described above, the light emitting layer 13 is provided as not a flat film but a film having a concave-convexity. Accordingly, in the case of comparing within the same plane size, the surface area of the light emitting layer 13 can be increased more than that case that it is provided as the flat film, and it is possible to increase an effective light emitting area of the light emitting layer 13. As a result, it is possible to suppress a reduction of the light emitting area while achieving a downsizing and a cost reduction on the basis of a reduction of a chip size, and a high efficiency can be realized even in a small chip size.

Next, a description will be given of a manufacturing method of the semiconductor light emitting device 1 of the embodiment, with reference to FIG. 3A to FIG. 16B. FIG. 3A to FIG. 16B show a partial region in a wafer state.

The semiconductor layer 15 is epitaxial grown on the substrate 10 which is the silicon substrate. In the embodiment, a buffer layer which reduces a lattice constant difference between the silicon substrate and the semiconductor layer 15 is included in the semiconductor layer 15.

Figure 3A:
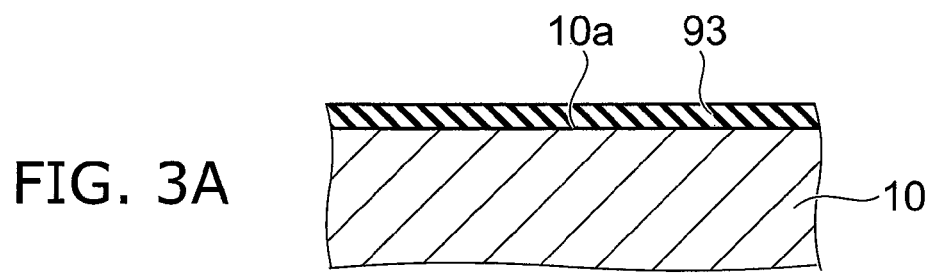

First of all, as shown in FIG. 3A, a mask 93 is formed on a whole face of the main face 10a of the substrate 10. The main face 10a is a (100) face of the silicon substrate. The mask 93 is, for example, a silicon oxide film.

Figure 3B:
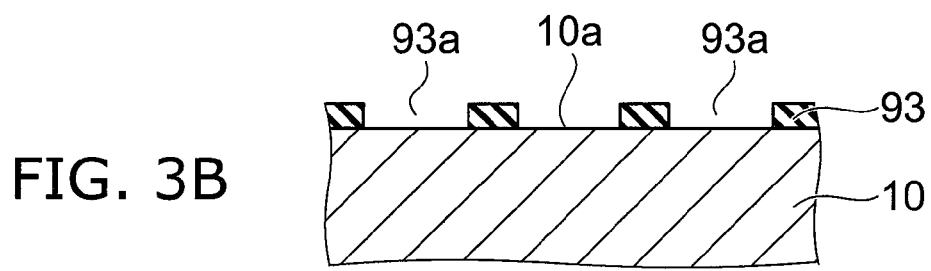

On the mask 93, a plurality, of openings 93a are selectively formed, as shown in FIG. 3B, in accordance with a lithography and an etching, for example, using a hydrofluoric acid. A plane shape of the opening 93a is quadrangular. The main face 10a of the substrate 10 is exposed to the opening 93a.

Further, a wet etching is carried out using the mask 93 on which the opening 93a is formed. As an etching fluid, for example, an alkali liquid such as a potassium hydroxide (KOH) or the like can be used.

The etching is a crystalline anisotropic etching of a silicon which utilizes a difference in an etching speed by a crystal face of the silicon. A (111) face in the silicon is harder to be etched than the (100) face, with respect to the alkaline etching fluid (the etching speed is low).

Figure 3C:
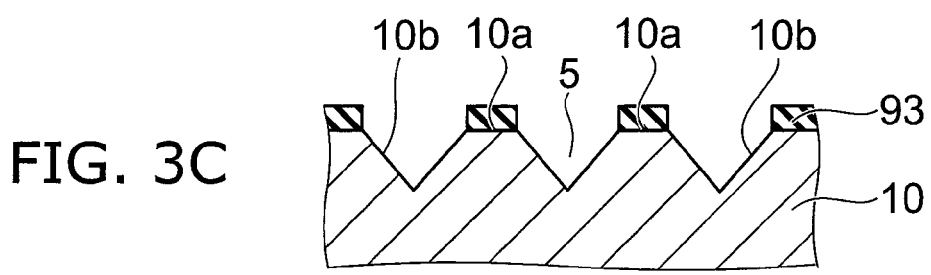
Figure 3D:
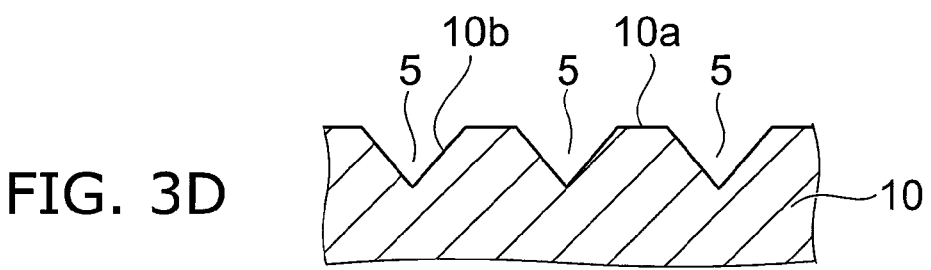
Figure 4:
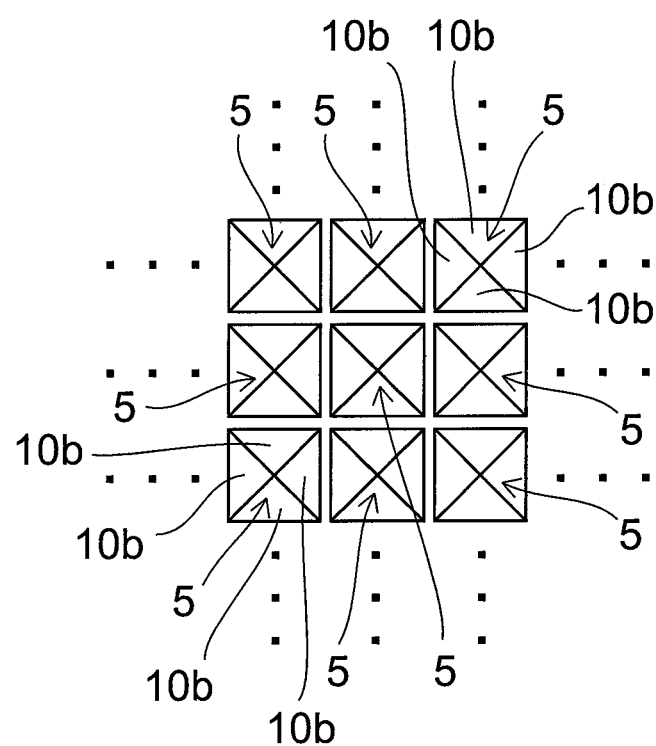

In other words, if the main face 10a of the substrate 10 in which a face direction is the (100) face is etched, the (111) face 10b which is inclined with respect to the main face 10a appears as shown in FIG. 3C. Thereafter, the mask 93 is removed by, for example, the hydrofluoric acid (FIG. 3D). A schematic plan view of the state is shown in FIG. 4.

In accordance with the crystalline anisotropic etching of the silicon mentioned above, concavities and convexities including a plurality of concave portions 5 are formed on the substrate 10. One concave portion 5 has four triangular (111) faces 10b which have a common apex in a bottom portion of the concave portion 5, as a side wall, as shown in FIG. 4.

The semiconductor layer 15 represented by $In_xAl_yGa_{1-x-y}N$ ($0 \leq x \leq 1$, $0 \leq y \leq 1$, $x+y \leq 1$) can be made less in its defect than the other crystal face in the silicon and can be epitaxial grown to the (111) face 10b.

Figure 3E:
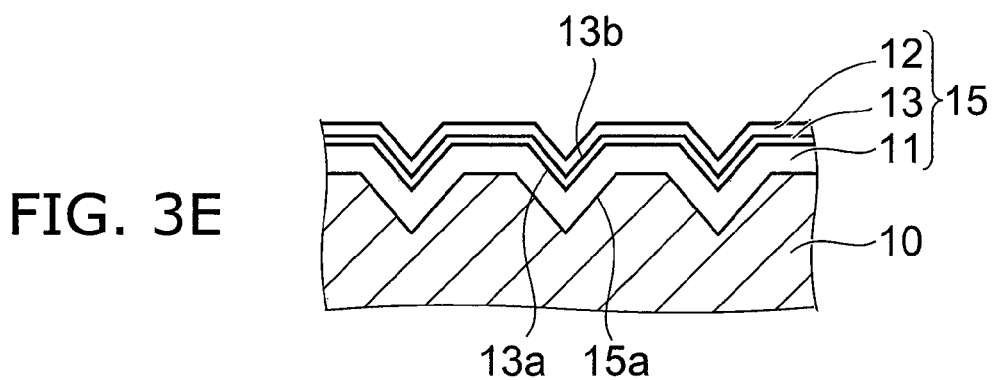

As shown in FIG. 3E, the first semiconductor layer 11 is formed on the concave-convex face of the substrate 10, the light emitting layer 13 is formed on the first semiconductor layer 11, and the second semiconductor layer 12 is formed on the light emitting layer 13.

The first semiconductor layer 11, the light emitting layer 13 and the second semiconductor layer 12 are all formed in a conformal manner along the concave-convex face of the substrate 10. Accordingly, a plurality of concave portions which are formed as a similar or close shape to a plurality of concave portions 5 shown in FIG. 4 formed in the substrate 10 are formed in the light emitting layer 13 in a plan view in which the light emitting layer 13 from the second semiconductor layer 12 side is seen.

As mentioned above, according to the embodiment, the surface area of the light emitting layer 13 is increased rather, than formed as the flat film, by forming the concavities and convexities in the substrate 10 and forming the semiconductor layer 15 including the light emitting layer 13 in a conformal manner along the concavities and convexities, whereby it is possible to expand an effective light emitting area.

Figure 20A:
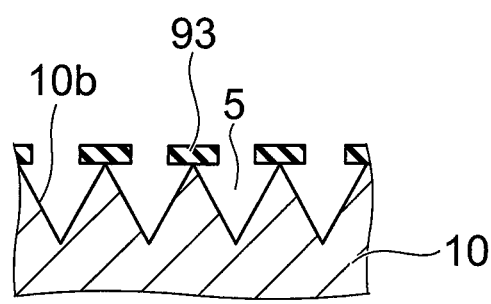
FIGS. 20A and 20B are schematic views showing a method for manufacturing a light emitting device of another embodiment.

On the basis of a control of an etching condition such as an etching time or the like, an upper end of the convex portion in the concavities and convexities of the substrate 10 can be formed as an acute shape, as shown in FIG. 20A.

Figure 20B:
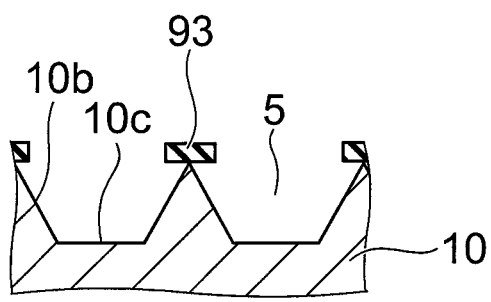

Further, FIG. 20B shows a configuration in which the flat face 10c serving as the same face direction (100) face as the main face of the substrate 10 is formed in the bottom of the concave portion 5. An opening pitch of the mask 93 in FIG. 20B is larger than the opening pitch of the mask 93 in FIG. 3B mentioned above. The first face 15a of the semiconductor layer 15 which is formed on the substrate 10 shown in FIG. 20B is a concave-convex shape including a convex portion in which an upper end is flat.

FIG. 5A is a schematic cross sectional view which corresponds to FIG. 3E, and FIG. 5B corresponds to a bottom elevational view in FIG. 5A.

After forming the semiconductor layer 15 in a whole face of the substrate 10, a groove 80 which reaches the substrate 10 through the semiconductor layer 15 is formed as shown in FIG. 6A and FIG. 6B corresponding to a bottom elevational view thereof, for example, in accordance with a reactive ion etching (RIE) method using a resist which is not illustrated. The groove 80 is formed, for example, as a lattice shape on the substrate 10 in the wafer state, and separates the semiconductor layer 15 into a plurality of chips on the substrate 10.

In this case, a process of separating the semiconductor layer 15 into a plurality of sections may be carried out after selectively removing the second semiconductor layer 12 mentioned later or forming the electrode.

Figures 7A, 7B:
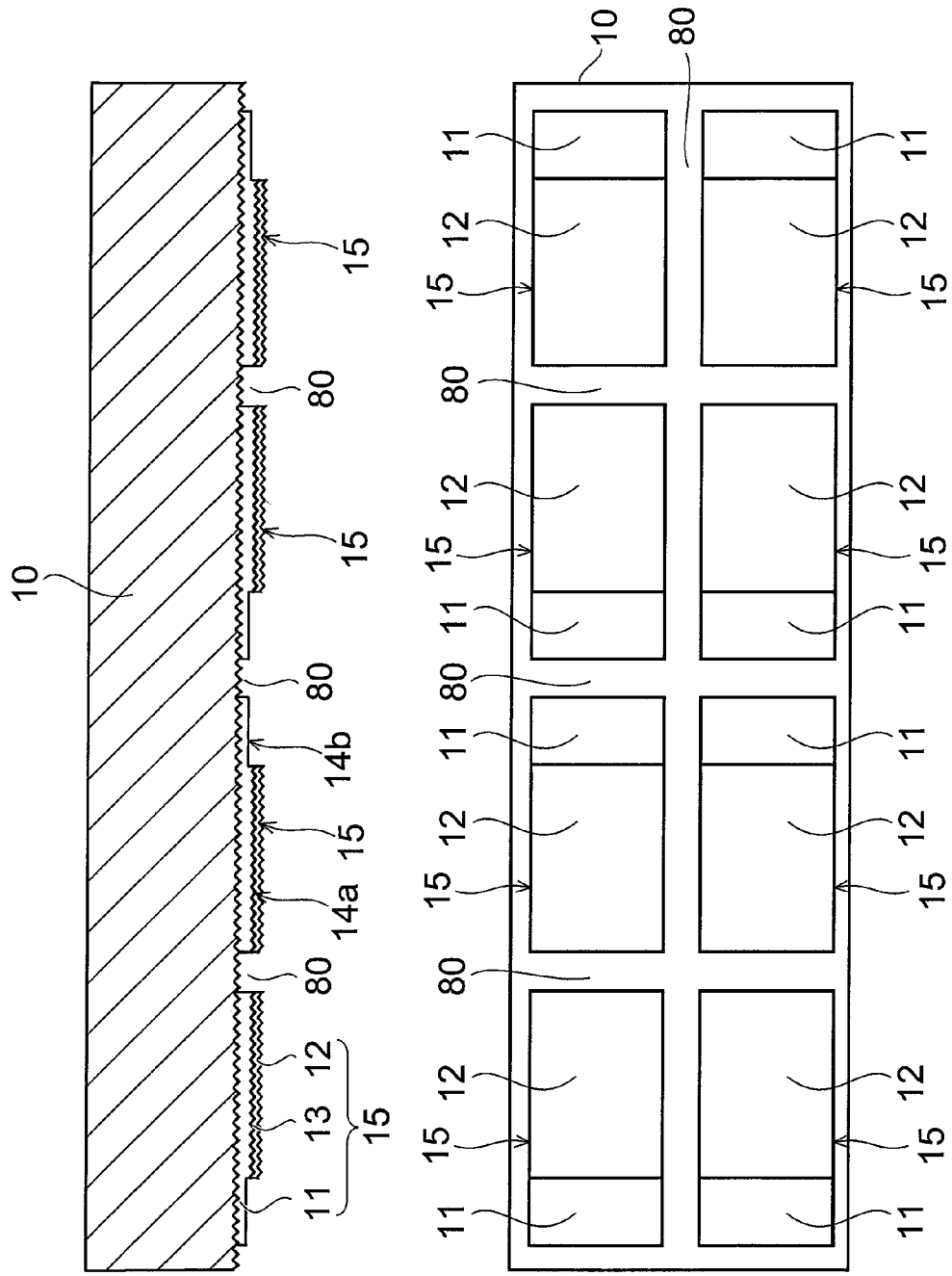

Next, the light emitting layer 13 and a part of the second semiconductor layer 12 are removed, and a part of the first semiconductor layer 11 is exposed, as shown in FIG. 7A and FIG. 7B corresponding to a bottom elevational view thereof, for example, in accordance with the RIE method using the resist which is not illustrated. A region in which the first semiconductor layer 11 is exposed is the n-side region 14b which does not include the light emitting layer 13.

Next, as shown in FIG. 8A and FIG. 8B corresponding to a bottom elevational view thereof, the p-side electrode 16 is formed on the surface of the second semiconductor layer 12, and the n-side electrode 17 is formed on the exposed face of the first semiconductor layer 11.

The p-side electrode 16 and the n-side electrode 17 are formed, for example, in accordance with a sputter method, a vapor deposition method or the like. Whichever of the p-side electrode 16 and the n-side electrode 17 may be formed in advance, or they may be formed simultaneously by the same material.

The p-side electrode 16 includes, for example, a silver, a silver alloy, an aluminum, an aluminum alloy or the like which has a reflecting property with respect to the light emitting light of the light emitting layer 13. Further, in order to prevent a sulfuration and an oxidation of the p-side electrode 16, it may be configured such as to include a metal protecting film (a barrier metal).

Further, for example, a silicon nitride film or a silicon oxide film may be formed in accordance with a chemical vapor deposition (CVD) method, as a passivation film between the p-side electrode 16 and the n-side electrode 17, or on the end face (the side face) of the light emitting layer 13. Further, an activation anneal or the like for obtaining an ohmic contact between each of the electrodes and the semiconductor layer may be executed as appropriate.

Next, after covering all the exposed portion on the substrate 10 by the insulating film 18 shown in FIG. 9A, the insulating film 18 is patterned, for example, in accordance with the wet etching, and the first opening 18a and the second opening 18b are formed selectively in the insulating film 18. The first opening 18a reaches the p-side electrode 16. The second opening 18b reaches the n-side electrode 17.

The concavities and convexities which reflect the concavities and convexities of the substrate 10 are formed on the contact face with the substrate 10 in the insulating film 18.

As the insulating film 18, for example, there can be employed an organic material such as a photosensitive polyimide, a benzocyclobutene or the like. In this case, it is possible to directly expose and develop with respect to the insulating film 18 without using any resist.

Alternatively, an inorganic film such as a silicon nitrogen film, a silicon oxide film or the like may be used as the insulating film 18. In the case that the insulating film 18 is the inorganic film, the first opening 18a and the second opening 18b are formed by an etching after patterning the resist which is formed on the insulating film 18.

Next, the metal film 19 is formed, as shown in FIG. 9B, on the surface of the insulating film 18, the inner wall (the side wall and the bottom portion) of the first opening 18a, and the inner wall (the side wall and the bottom portion) of the second opening 18b. The metal film 19 is used as a seed metal for plating mentioned later.

The metal film 19 is formed, for example, in accordance with the sputter method. The metal film 19 includes, for example, a stacked film of a titanium (Ti) and a copper (Cu) which are stacked in this order from the insulating film 18 side. Alternatively, an aluminum film may be used in place of the titanium film.

Next, as shown in FIG. 9C, a resist 91 is selectively formed on the metal film 19, and a Cu electrolyte plating using the metal film 19 as a current route is carried out.

Accordingly, as shown in FIG. 10A and FIG. 10B corresponding to a bottom elevational view thereof, the p-side interconnection layer 21 and the n-side interconnection layer 22 are selectively formed on the metal film 19. The p-side interconnection layer 21 and the n-side interconnection layer 22 are formed simultaneously in accordance with a plating method and are made, for, example, of a cupper material.

The p-side interconnection layer 21 is formed within the first opening 18a, and is electrically connected to the p-side electrode 16 via the metal film 19. The n-side interconnection layer 22 is formed within the second opening 18b, and is electrically connected to the n-side electrode 17 via the metal film 19.

The resist 91 which is used for plating the p-side interconnection layer 21 and the n-side interconnection layer 22 is removed using solvent or an oxygen plasma.

Next, as shown in FIG. 11A and FIG. 11B corresponding to a bottom elevational view thereof, a resist 92 for forming the metal pillar is formed. The resist 92 is thicker than the resist 91 mentioned above. In this case, the resist 91 may be left without being removed in the preceding process, and the resist 92 may be formed in an overlapping manner with the resist 91. A first opening 92a and a second opening 92b are formed in the resist 92.

Figures 12A, 12B:
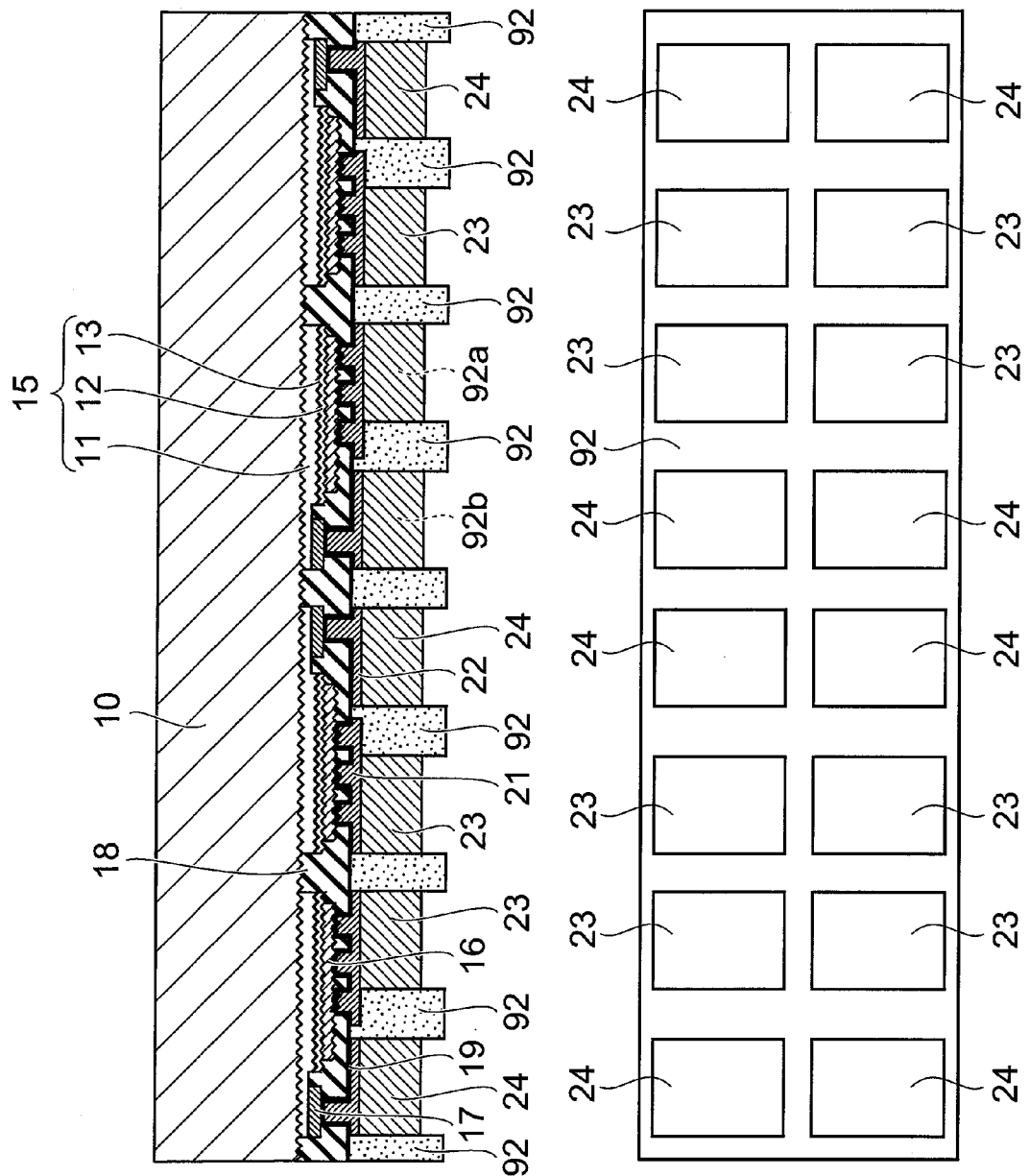

Further, a Cu electrolyte plating in which the metal film 19 is set to the current route is carried out using the resist 92 as a mask. Accordingly, as shown in FIG. 12A and FIG. 12B corresponding to a bottom elevational view thereof, the p-side metal pillar 23 and the n-side metal pillar 24 are formed.

The p-side metal pillar 23 is formed on the surface of the p-side interconnection layer 21 within the first opening 92a which is formed in the resist 92. The n-side metal pillar 24 is formed on the surface of the n-side interconnection layer 22 within the second opening 92b which is formed in the resist 92. The p-side metal pillar 23 and the n-side metal pillar 24 are formed simultaneously in accordance with the plating method, and is made, for example, of a cupper material.

The resist 92 is removed, for example, using the solvent or the oxygen plasma, as shown in FIG. 13A. Thereafter, the exposed portion of the metal film 19 is removed in accordance with the wet etching, by setting the metal pillar 23, the n-side metal pillar 24, the p-side interconnection layer 21 and the n-side interconnection layer 22 to a mask. Accordingly, as shown in FIG. 13B, the electric connection via the metal film 19 between the p-side interconnection layer 21 and the n-side interconnection layer 22 is segmented.

Next, as shown in FIG. 14A, the resin layer 25 is stacked with respect, to the insulating film 18. The resin layer 25 covers the p-side interconnection layer 21, the n-side interconnection layer 22, the p-side metal pillar 23 and the n-side metal pillar 24.

The resin layer 25 has an insulating property. Further, the resin layer 25 may be included, for example, by a carbon black, and a light insulating property may be applied to the light emitting light of the light emitting layer 13.

Next, as shown in FIG. 14B, the substrate 10 is removed. The substrate 10 corresponding to the silicon substrate can be removed by an etching.

Since the above-mentioned stacked body which is formed on the substrate 10 is reinforced by the p-side metal pillar 23, the n-side metal pillar 24 and the resin layer 25 which are thicker than the semiconductor layer 15, the wafer state can be maintained even if the substrate 10 runs short.

Further, the resin layer 25, and the metal configuring the p-side metal pillar 23 and the n-side metal pillar 24 are a more flexible material in comparison with the semiconductor layer 15. The semiconductor layer 15 is supported by the flexible support body mentioned above. Accordingly, even if a great internal stress which is generated at a time of epitaxial growing the semiconductor layer 15 on the substrate 10 is released at a stroke at a time of removing the substrate 10, it is possible to avoid the breakage of the semiconductor layer 15.

The first face 15a of the semiconductor layer 15 from which the substrate 10 is removed, shown in FIG. 15A is washed. The gallium (Ga) attached to the first face 15a is removed, for example, by a diluted hydrofluoric acid or the like.

Next, as shown in FIG. 15B, the phosphor layer 30 is formed on the first face 15a. The phosphor layer 30 is formed on the insulating film 18 between the adjacent semiconductor layers 15.

The liquid transparent resin 31 in which the phosphor 32 is dispersed is supplied onto the first face 15a, for example, in accordance with a printing method, a potting method, a molding method, a compression forming method or the like, and is thereafter hardened.

Next, a surface (a lower face in FIG. 15B) of the resin layer 25 is ground, and the p-side outer terminal 23a and the n-side outer terminal 24a are exposed, as shown in FIG. 16A and FIG. 16B corresponding to a bottom elevational view thereof.

Thereafter, the phosphor layer 30 the insulating film 18 and the resin layer 25 are cut at a position of the groove 80 mentioned above, and are segmented into a plurality of semiconductor light emitting devices 1. For example, they are cut using a dicing blade. Alternatively, they may be cut with a laser irradiation.

The substrate 10 has been already removed at a time of dicing. Further, since the semiconductor layer 15 does not exist in the groove 80, it is possible to avoid a damage to which the semiconductor layer 15 is exposed at a time of dicing. Further, without any additional process after being segmented, it is possible to obtain a configuration in which the end portion (the side face) of the semiconductor layer 15 is covered and protected by the insulating film 18.

In this case, the segmented semiconductor light emitting device 1 may be formed as a single chip configuration which includes one semiconductor layer 15 or may be formed as a multiple chip configuration which includes a plurality of semiconductor layers 15.

Since each of the processes mentioned above before dicing is carried out in a lump in the wafer state, it is not necessary to carry out a interconnection and a packaging per the segmented individual device, and it is possible to widely reduce a production cost. In other words, the interconnection and the packaging have been already carried out in the segmented state. Accordingly, it is possible to enhance a productivity. As a result, it is easy to reduce a cost.

On the first surface 15a, a lens 36 may be provided such as a semiconductor light emitting device 2 shown in FIGS. 17A to 17C and FIG. 18. The lens 36 is not limited to be formed as a concave shape, but may be formed as a convex shape.

Figure 17A:
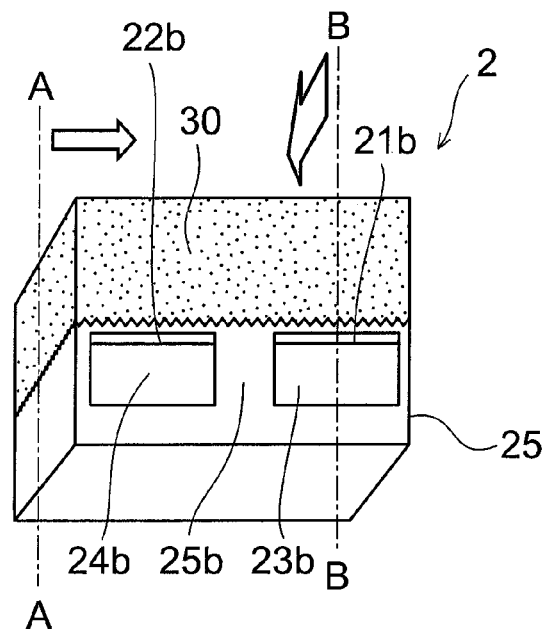
FIGS. 17A to 17C are schematic views of a light emitting device of another specific example of the embodiment.
Figure 17B:
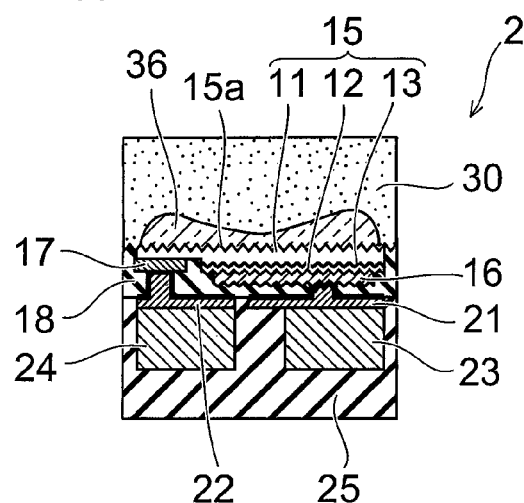
Figure 17C:
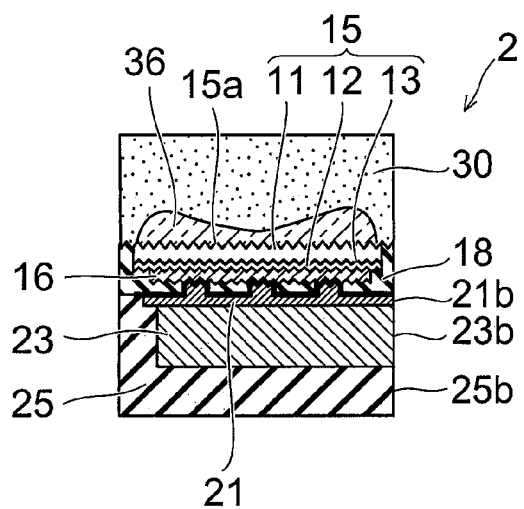

FIG. 17A is a schematic perspective view of the semiconductor light emitting device 2 of a variation of the embodiment. FIG. 17B is a cross sectional view along a line A-A in FIG. 17A. FIG. 17C is a cross sectional view along a line B-B in FIG. 17A.

Figure 18:
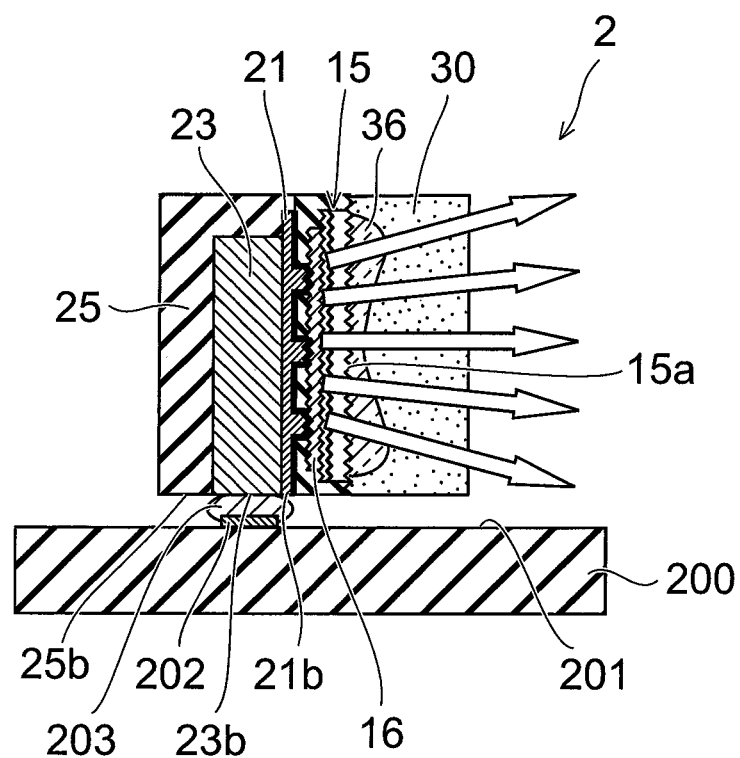
FIG. 18 is a schematic cross-sectional view of the semiconductor light emitting device shown in FIG. 17 mounted on a mount substrate.

FIG. 18 is a schematic cross sectional view of a light emitting module having a configuration in which the semiconductor light emitting device 2 is mounted on a mounting substrate 200.

As shown in FIGS. 17A and 17C, a side face of a part of the p-side metal pillar 23 is a third face 25b having a different face direction from the first face 15a and the second face of the semiconductor layer 15, and is exposed from the resin layer 25. The exposed face serves as the p-side outer terminal 23b for mounting to the mounting substrate in an outer portion.

The third face 25b is a face which is approximately vertical to the first face 15a and the second face of the semiconductor layer 15. The resin layer 25 has four side faces, for example, formed as a rectangular shape, and one of the side faces is the third face 25b.

In the same third face 25b, a side face of a part of the n-side metal pillar 24 is exposed from the resin layer 25. The exposed face serves as the n-side outer terminal 24b for mounting to the mounting substrate in the outer portion.

Further, as shown in FIG. 17A, the side face 21b of a part of the p-side interconnection layer 21 is exposed from the resin layer 25 in the third face 25b, and serves as the p-side outer terminal. In the same manner, the side face 22b of a part of the n-side interconnection layer 22 is exposed from the resin layer 25 in the third face 25b, and serves as the n-side outer terminal.

In the p-side metal pillar 23, the portions other than the p-side outer terminal 23b which are exposed in the third face 25b are covered by the resin layer 25. Further, in the n-side metal pillar 24, the portions other than the n-side outer terminal 24b which are exposed in the third face 25b are covered by the resin layer 25.

Further, in the p-side interconnection layer 21, the portions other than the side face 21b which are exposed in the third face 25b are covered by the resin layer 25. Further, in the n-side interconnection layer 22, the portions other than the side face 22b which are exposed in the third face 25b are covered by the resin layer 25.

The semiconductor light emitting device 2 is mounted in such a manner in which the third face 25b is directed to a mounting face 201 of the mounting substrate 200, as shown in FIG. 18. Each of the p-side outer terminal 23b and the n-side outer terminal 24b which are exposed in the third face 25b is bonded to a pad. 202 which is formed in the mounting face 201 via a solder 203. A interconnection pattern is formed in the mounting face 201 of the mounting substrate 200, and the pad 202 is connected to the interconnection pattern.

The third face 25b is approximately vertical to the first face 15a which is a main emitting face of the light. Accordingly, in such a manner in which the third face 25b is directed downward to the mounting face 201 side, the first face 15a is directed not to above the mounting face 201 but to a transverse direction. In other words, the semiconductor light emitting device 2 is a so-called side view type semiconductor light emitting device in which the light is discharged in the transverse direction in the case that the mounting face 201 is a horizontal face.

Figure 19B:
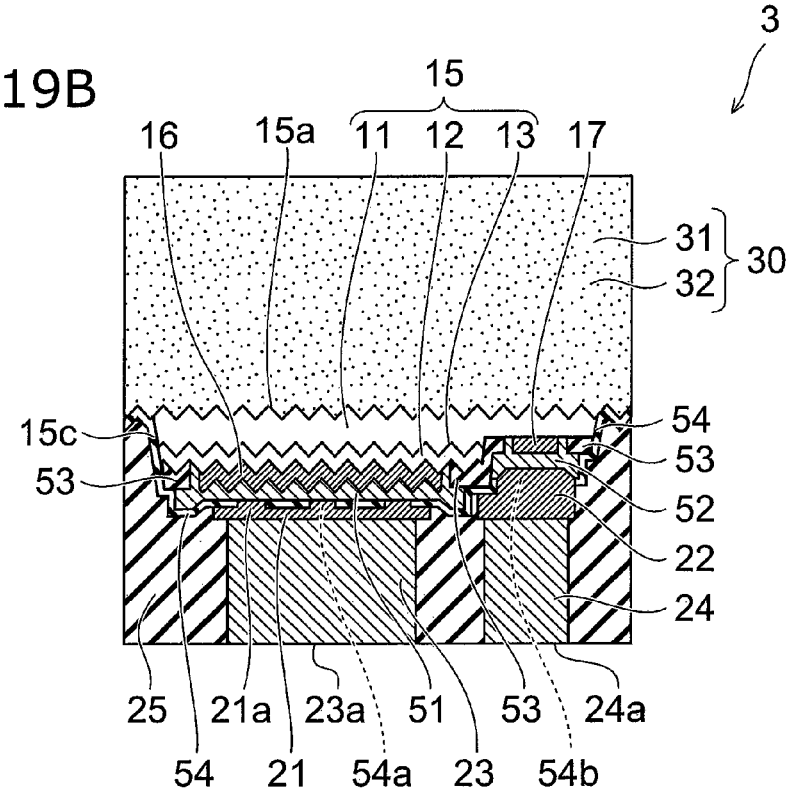

Further, FIG. 19B is a schematic cross sectional view of a semiconductor light emitting device 3 according to the other variation of the embodiment.

In the semiconductor light emitting device 3 shown in FIG. 19B, a p-side pad 51 which covers the p-side electrode 16 is provided on a surface and a side face of the p-side electrode 16. The p-side electrode 16 includes, for example, at least one of a nickel (Ni), a gold (Au) and a rhodium (Rh) which can form an alloy with the gallium (Ga) included in the semiconductor layer 15. The p-side pad 51 is higher in a reflectance with respect to the light emitting light of the light emitting layer 13 than the p-side electrode 16, and includes, for example, the silver (Ag) as a main component. Further, the p-side pad 51 protects the p-side electrode 16 from an oxidation and a corrosion.

Further, an n-side pad 52 which covers the n-side electrode 17 is provided on a surface and a side face of the n-side electrode 17. The n-side electrode 17 includes, for example, at least one of the nickel (Ni), the gold (Au) and the rhodium (Rh) which can form the alloy with the gallium (Ga) included in the semiconductor layer 15. The n-side pad 52 is higher in a reflectance with respect to the light emitting light of the light emitting layer 13 than the n-side electrode 17, and includes, for example, the silver (Ag) as a main component. Further, the n-side pad 52 protects the n-side electrode 17 from an oxidation and a corrosion.

An insulating film 53, for example, a silicon oxide film, a silicon nitride film or the like is provided in a periphery of the p-side electrode 16 and a periphery of the n-side electrode 17 in a face in an opposite side to the first face 15a in the semiconductor layer 15. The insulating film 53 is provided between the p-side electrode 16 and the n-side electrode 17, and between the p-side pad 51 and the n-side pad 52.

An insulating film 54, for example, a silicon oxide film, a silicon nitride film or the like is provided on the insulating film 53, on the p-side pad 51 and on the n-side pad 52. Further, the insulating film 54 is provided on the side face 15c of the semiconductor layer 15, and covers the side face 15c.

The p-side interconnection layer 21 and the n-side interconnection layer 22 are provided on the insulating film 54. The p-side interconnection layer 21 is connected to the p-side pad 51 through a first opening 54a which is formed in the insulating film 54. The n-side interconnection layer 22 is connected to the n-side pad 52 through a second opening 54b which is formed in the insulating film 54.

In the configuration, the p-side interconnection layer 21 may be connected to the p-side pad 51 via a plurality of vias 21a as shown in FIG. 19B, or may be connected to the p-side pad 51 via one post in which a plane size is larger than the via 21a.

The p-side metal pillar 23 which is thicker than the p-side interconnection layer 21 is provided on the p-side interconnection layer 21. The n-side metal pillar 24 which is thicker than the n-side interconnection layer 22 is provided on the n-side interconnection layer 22.

The resin layer 25 is stacked with respect to the insulating film 54. The resin layer 25 covers the p-side interconnection portion which includes the p-side interconnection layer 21 and the p-side metal pillar 23, and the n-side interconnection portion which includes the n-side interconnection layer 22 and the n-side metal pillar 24. In this case, a face (a lower face in the drawing) in an opposite side to the p-side interconnection layer 21 in the p-side metal pillar 23 is exposed from the resin layer 25, and serves as the p-side outer terminal 23a. In the same manner, a face (a lower face in the drawing) in an opposite side to the n-side interconnection layer 22 in the n-side metal pillar 24 is exposed from the resin layer 25, and serves as the n-side outer terminal 24a.

Alternatively, the side face of the p-side metal pillar 23 and the side face of the n-side metal pillar 24 may be exposed, so as to be a side view type semiconductor light emitting device.

The resin layer 25 is filled into the groove 80 mentioned above which separates the semiconductor layer 15 into a plurality of sections on the substrate 10, via the insulating film 54. Accordingly, the side face 15c of the semiconductor layer 15 is covered and protected by the insulating film 54 which is the inorganic film, and the resin layer 25.

In accordance with the embodiment, a concave-convexity process is previously applied to the substrate 10 for growing the semiconductor layer 15. The concave-convexity process with respect to the substrate 10 which is the silicon substrate is easily carried out.

Further, the semiconductor layer 15 is formed on the concave-convex face of the substrate 10. Accordingly, after removing the substrate 10, the face (the first face 15a) which is in contact with the substrate 10 in the semiconductor layer 15 is the concave-convex face. Accordingly, a roughening process which enhances a light pickup efficiency, after removing the substrate, is eliminated. Further, it is possible to reduce an efficiency reduction due to a damage (a deterioration) at a time of the roughening process of the semiconductor layer 15.

Figure 21A:
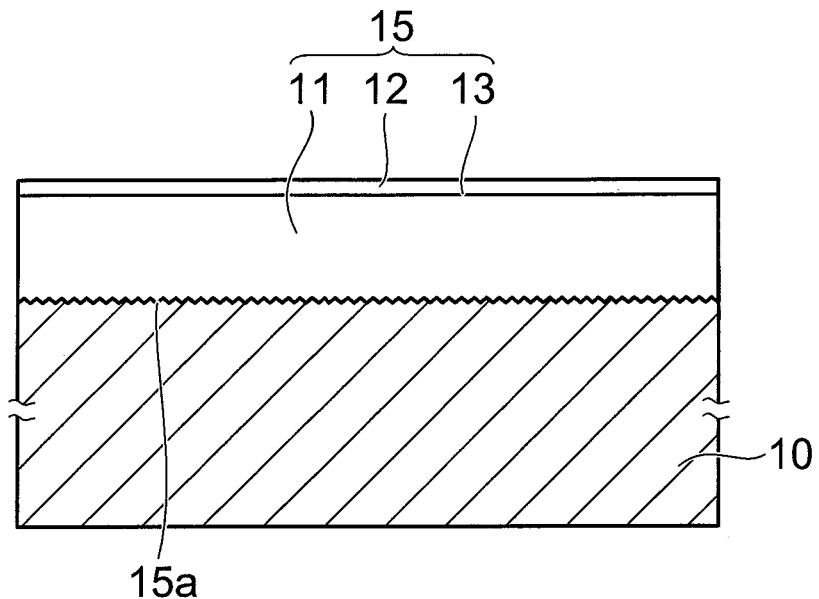
FIGS. 21A to 24B are schematic views showing a method for manufacturing a light emitting device of still another embodiment.

In some process depth of the concavities and convexities of the substrate 10, and some film thickness of the semiconductor layer 15 which is formed on the concave-convex face, as shown in FIG. 21A, the light emitting layer 13 and the second semiconductor layer 12 can be formed as the flat film without generating any concavities and convexities.

Figure 21B:
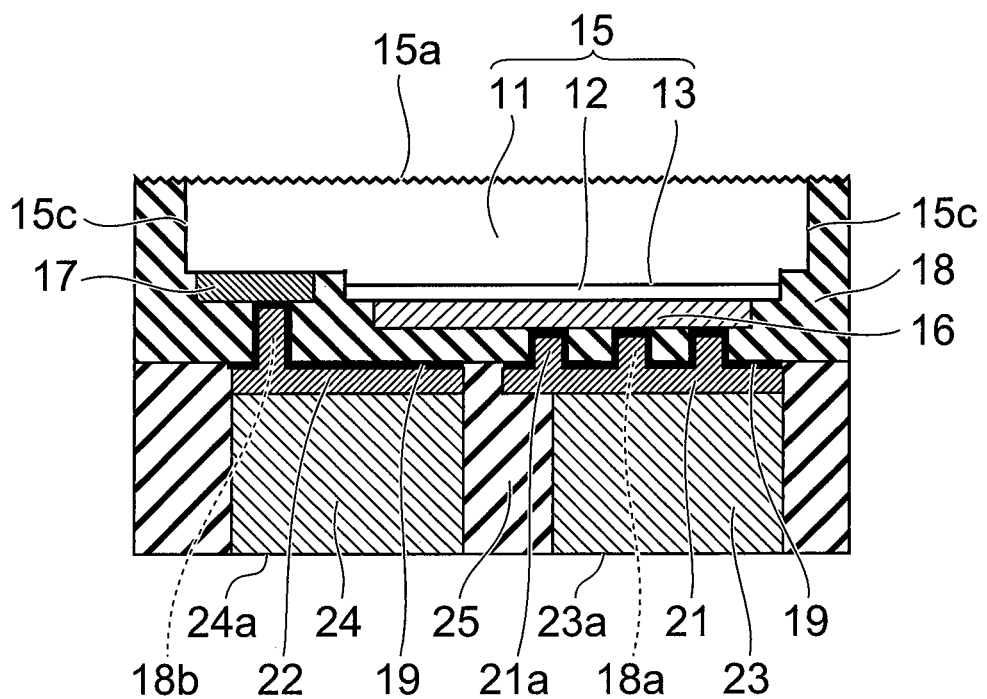

Even in this case, the concavities and convexities which reflect the concavities and convexities of the substrate 10 are formed on the first face 15a which is the light pickup face. In other words, in the same manner as mentioned above, if the substrate 10 is removed after forming the electrodes 16 and 17, the insulating film 18, the interconnection layers 21 and 22, the metal pillars 23 and 24, the resin layer 25 and the like, the first face 15a which is the concave-convex face is exposed, as shown in FIG. 21B. Accordingly, there can be obtained a configuration in which the light pickup efficiency is enhanced without carrying out the roughening process after removing the substrate. Further, it is possible to prevent an efficiency reduction due to the damage (the deterioration) at a time of the roughening process of the semiconductor layer 15.

Next, FIGS. 22A to 22E are schematic cross sectional views which show a manufacturing method of a semiconductor light emitting device of still another embodiment.

Figure 22A:
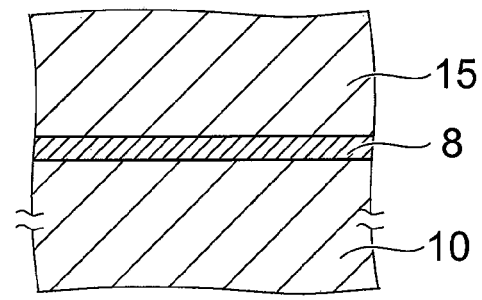

As shown in FIG. 22A, the semiconductor layer 15 is formed on a main face of the substrate 10 via an aluminum nitride (AlN) film 8. The substrate 10 is not limited to the silicon substrate, but may be a sapphire substrate. The AlN film 8 serves as a buffer layer which reduces a lattice unconformity between the substrate 10 and the GaN semiconductor layer 15. The main face of the substrate 10 is not formed as the concavities and convexities, and the AlN film 8 is formed on a flat face.

The buffer layer is not limited to the AlN film, but can employ a silicon nitride film (a SiN film), a silicon oxynitride film (a SiON film), a silicon oxide film including a carbon (a SiOC film), and a silicon carbide film (a SiC film).

After forming the semiconductor layer 15, the p-side electrode and the n-side electrode are formed in the semiconductor layer 15 in the same manner as the embodiment mentioned above, and the support body including the interconnection layer, the metal pillar and the resin layer is formed in an opposite side to the substrate 10. Further, after forming the support body, the substrate 10 is removed.

Figure 22B:
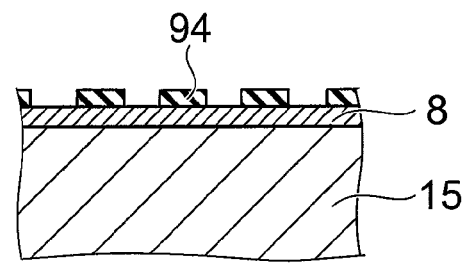

The AlN film 8 is exposed by removing the substrate 10. A resist 94 is formed and patterned on the AlN film 8, as shown in FIG. 22B.

Figure 22C:
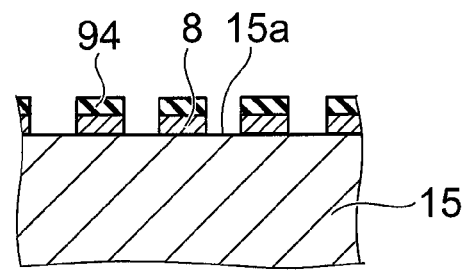

Further, the AlN film 8 is processed, for example, in accordance with the RIE method using a BCl$_3$ gas, as shown in FIG. 22C, by setting the patterned resist 94 to a mask. Further, the GaN semiconductor layer 15 is subsequently processed in accordance with the RIE method while leaving the resist 94. Alternatively, the semiconductor layer 15 can be processed in accordance with a wet process which uses a potassium hydroxide (KOH), a tetramethylammonium hydroxide (TMAH) or the like.

Figure 22D:
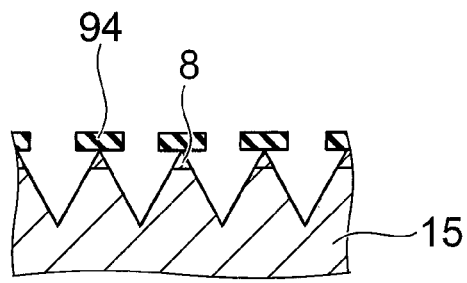

Accordingly, as shown in FIG. 22D, the concavities and convexities are formed on the surface (the first face) of the semiconductor layer 15. At a time of processing the semiconductor layer 15, the AlN film 8 is not completely removed, but is partly left in an upper end (a top portion) of the convex portion of the semiconductor layer 15.

Figure 22E:
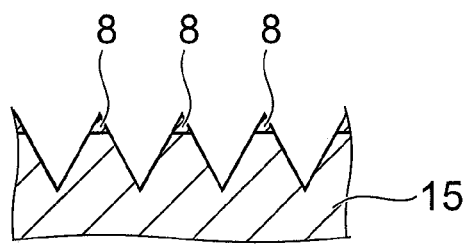

Thereafter, the resist 94 is removed in accordance with an ashing method which uses an oxygen (FIG. 22E). In accordance with the embodiment, there can be obtained a configuration in which the concavities and convexities are formed on the light pickup face (the first face) of the semiconductor layer 15, and the AlN film 8 is provided in the upper end (the top portion) of the convex portion in the concave-convex face of the semiconductor layer 15. The AlN film 8 is not provided in the concave portion in the concave-convex face of the semiconductor layer 15, but the AlN film 8 is selectively provided only in the upper end (the top portion) of the convex portion.

The AlN film 8 having a different refraction index from the GaN material of the light pickup face exists in the light pickup face of the semiconductor layer 15. Accordingly, it is possible to suppress a color breakup and improve the light pickup efficiency, on the basis of a light scattering effect by the AlN film 8. Further, since the AlN film 8 exists in the light pickup surface, a roughened shaped of the light pickup face becomes stable, and it is possible to improve a light pickup efficiency.

As the buffer layer, the materials mentioned above can be employed in addition to the AlN film. Even in the case that the materials other than the AlN film are used as the buffer layer, there is provided a configuration in which a film (a SiN film, a SiON film, an SiOC film or a SiC film) of a material having a different refraction index from the GaN semiconductor layer 15 is provided in the upper end (the top portion) of the convex portion of the first face of the semiconductor layer 15. Even in this case, it is possible to suppress the color breakup and improve the light pickup efficiency on the basis of the light scattering effect by the film.

Figure 25:
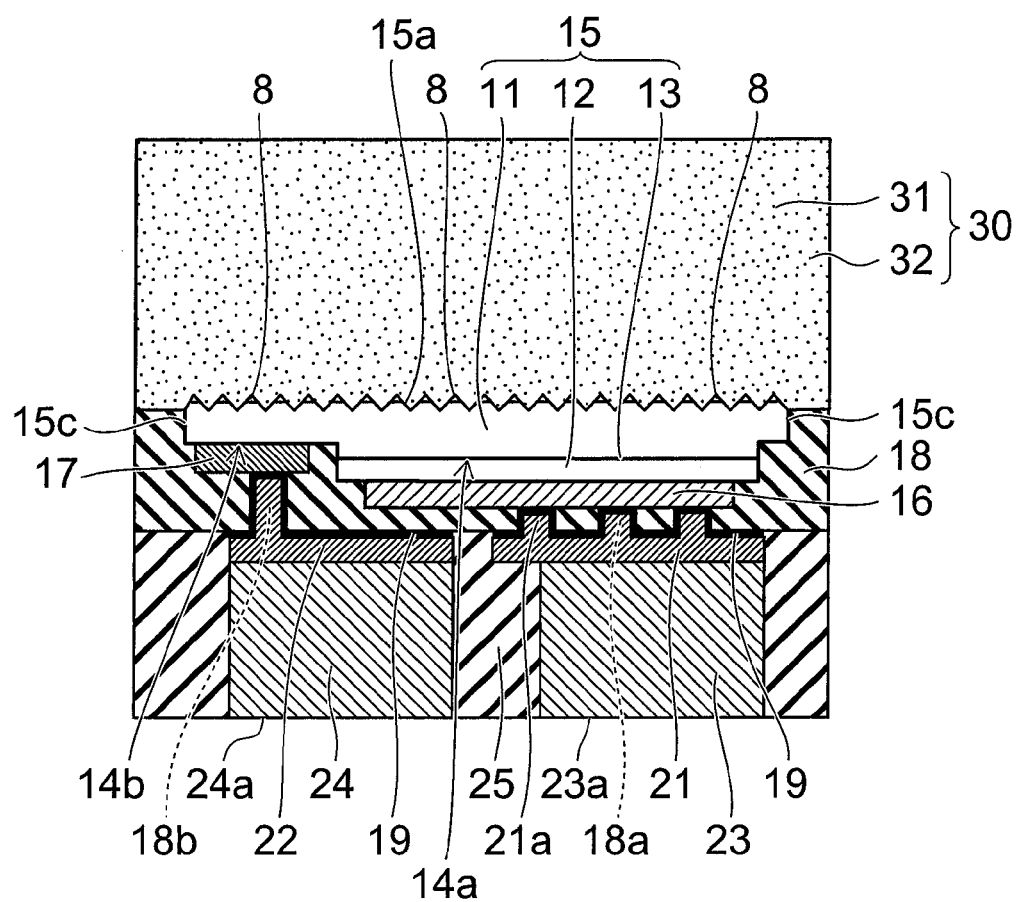
FIG. 25 is a schematic cross-sectional view of a light emitting device of still another embodiment.

FIG. 25 is a schematic cross sectional view of a semiconductor light emitting device in which a film (for example, exemplified by the AlN film 8) having the different refraction index from the semiconductor layer 15 is provided in the upper end (the top portion) of the convex portion in the concavities and convexities of the first face 15a.

In a face in an opposite side to the first face 15a in the semiconductor layer 15, in the same manner as the embodiment mentioned above, the p-side electrode 16 and the n-side electrode 17 are provided. Further, the insulating film 18 which covers the p-side electrode 16 and the n-side electrode 17 is provided in an opposite side to the first face 15a, and the p-side interconnection layer 21 which is connected to the p-side electrode 16, and the n-side interconnection layer 22 which is connected to the n-side electrode 17 are provided on the insulating film 18. The p-side metal pillar 23 is provided on the p-side interconnection layer 21, and the n-side metal pillar 24 is provided on the n-side interconnection layer 22. The resin layer 25 is provided in the periphery of the p-side metal pillar 23 and the periphery of the n-side metal pillar 24.

In the semiconductor layer 15 shown in FIG. 25, the concavities and convexities are formed only in the first face 15a, and the light emitting layer 13 is formed as not n concave-convex shape but a flat film. In this case, in the same manner as the embodiment mentioned above, in the semiconductor light emitting device shown in FIG. 25, the light emitting layer 13 may be formed as n concave-convex shape, so as to achieve an enlargement of an effective light emitting area.

Figure 26A:
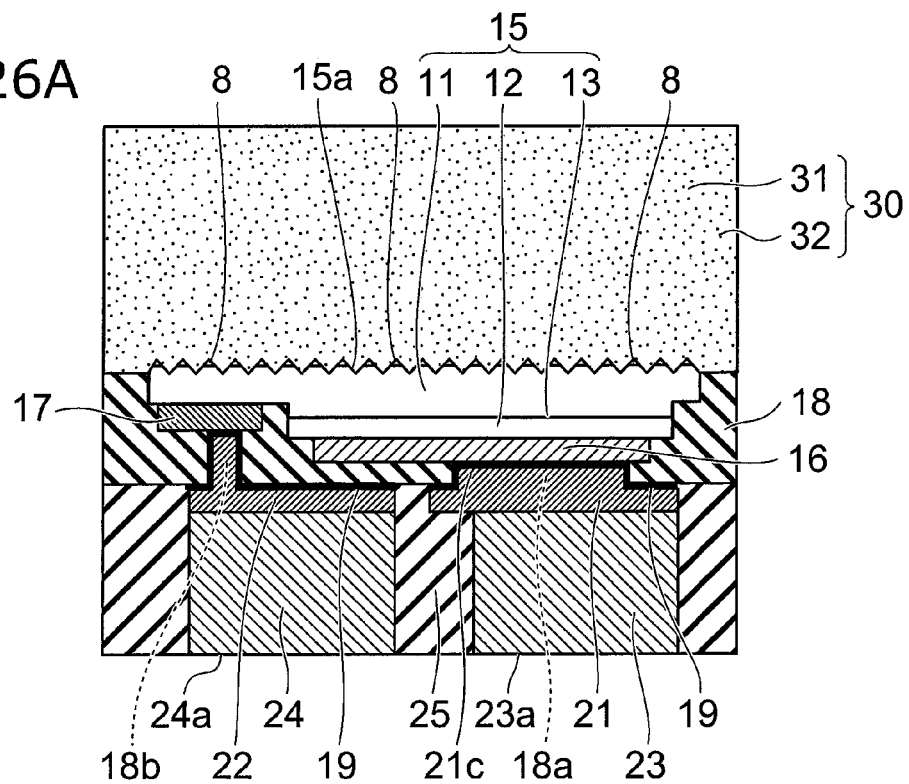
FIG. 26A and 26B are schematic cross-sectional views of a light emitting device of still another embodiment.

Further, the configuration in which the film having the different refraction index from the semiconductor layer 15 such as the AlN film 8 or the like is selectively provided in the upper end (the top portion) of the convex portion in the concavities and convexities of the first face 15a can be applied to the configuration in FIG. 19A mentioned above, as shown in FIG. 26A.

Figure 26B:
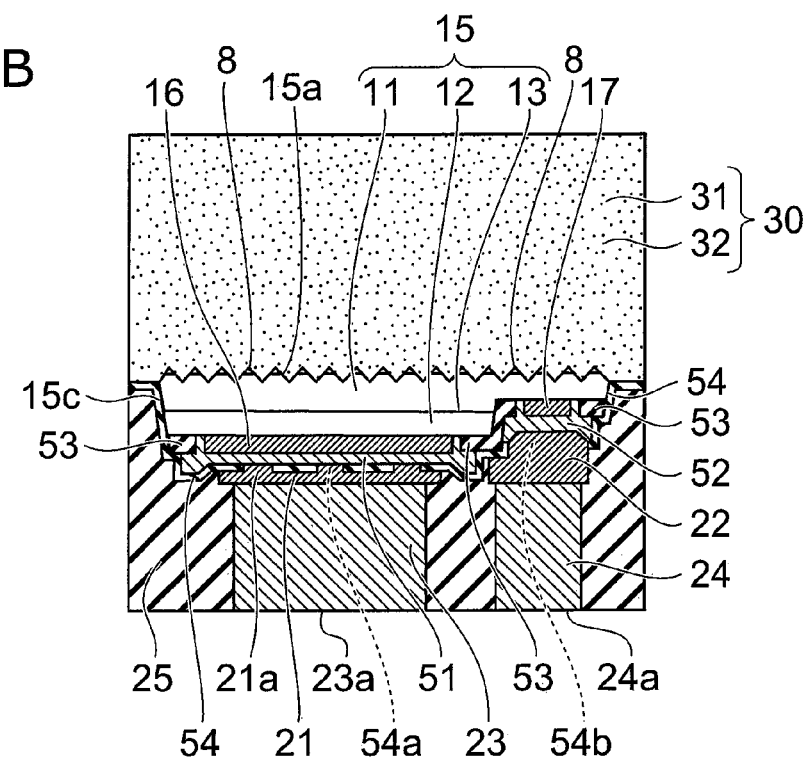

Further, the configuration in which the film having the different refraction index from the semiconductor layer 15 such as the AlN film 8 or the like is selectively provided in the upper end (the top portion) of the convex portion in the concavities and convexities of the first face 15a can be applied to the configuration in FIG. 19B mentioned above, as shown in FIG. 26B. In this case, in FIGS. 26A and 26B, the light emitting layer 13 may be formed as a concave-convex shape.

Figure 23A:
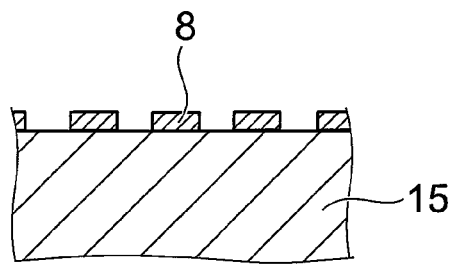
Figure 23B:
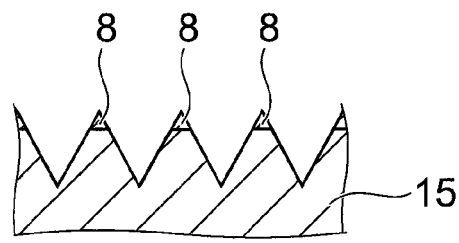

After patterning the AlN film 8 in a process shown in FIG. 22C, the resist 94 may be removed as shown in FIG. 23A. Further, the semiconductor layer 15 can be formed as a concave-convex face as shown in FIG. 23B, for example, in accordance with the RIE using the $Cl_2$ gas, or the wet process using the KOH, the TMAH or the like, by setting the patterned AlN film 8 as a mask. In this case, the AlN film 8 can be left in the upper end (the top portion) of the convex portion in the concave-convex face of the semiconductor layer 15.

Alternatively, the roughening process (the concave-convexity process) of the semiconductor layer 15 can be carried out by utilizing a defect of the AlN film 8 without patterning the AlN film 8. In the case that the SiN film, the SiON film, the SiOC film or the SiC film is used as the buffer layer, it is possible to roughen the semiconductor layer 15 by utilizing the defect of the film.

Figure 24A:
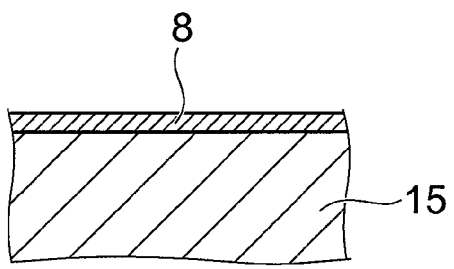
Figure 24B:
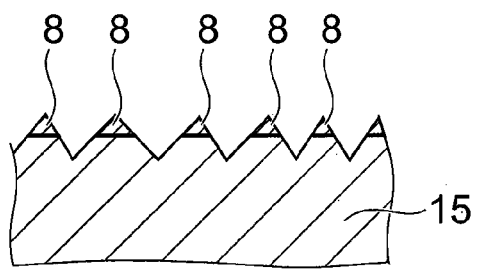

In other words, as shown in FIG. 24A, the resist is not formed on the AlN film 8, and the AlN film 8 is not patterned. Further, if the wet process using the KOH or the TMAH is carried out with respect to the AlN film 8, the crystalline anisotropy etching makes progress starting from the crystalline defect of the AlN film 8, the semiconductor layer 15 of the foundation is etched as shown in FIG. 24B, and the semiconductor layer 15 is roughened (concave-convexity processed).

Random concavities and convexities corresponding to the defect of the AlN film 8 are formed on the light pickup face of the semiconductor layer 15. A shape, a size and a repeating pitch of the concavities and convexities which are formed in the semiconductor layer 15 are at random. In this case, the AlN film 8 can be left in the upper end (the top portion) of the convex portion in the concave-convex face of the semiconductor layer 15.

In each of the embodiments mentioned above, the p-side interconnection layer 21 and the n-side interconnection layer 22 may be bonded to the pad of the mounting substrate, without providing the p-side metal pillar 23 and the n-side metal pillar 24.

Further, the p-side interconnection layer 21 and the p-side metal pillar 23 are not limited to be the separated bodies, but the p-side interconnection portion may be configured by integrally providing the p-side interconnection layer 21 and the p-side metal pillar 23 in the same process. In the same manner, the n-side interconnection layer 22 and the n-side metal pillar 24 are not limited to be the separated bodies, but the n-side interconnection portion may be configured by integrally providing the n-side interconnection layer 22 and the n-side metal pillar 24 in the same process.

In accordance with the manufacturing method of the semiconductor light emitting device of the embodiment, the process of forming the concavities and convexities on the main face of the substrate has a process of forming the mask in which the opening is selectively formed, on the main face of the silicon substrate, and a process of crystalline anisotropy etching the silicon substrate using the mask.

Further, in accordance with the manufacturing method of the semiconductor light emitting device of the embodiment, the main face of the silicon substrate is the (100) face, and the (111) face which is inclined with respect to the (100) face is exposed in accordance with the crystalline anisotropy etching of the (100) face.

Further, in accordance with the manufacturing method of the semiconductor light emitting device of the embodiment, there are provided a process of forming the support body in the opposite side to the substrate, after forming the p-side electrode and the n-side electrode, and a process of removing the substrate after forming the support body.

Further, in accordance with the manufacturing method of the semiconductor light emitting device of the embodiment, the process of forming the support body has a process of forming the p-side interconnection portion which is electrically connected to the p-side electrode, and the n-side interconnection portion which is electrically connected to the n-side electrode.

Further, in accordance with the manufacturing method of the semiconductor light emitting device of the embodiment, the process of forming the support body further has a process of forming the resin layer between the p-side interconnection portion and the n-side interconnection portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor light emitting device comprising:
a first nitride semiconductor layer having a first face and a second face opposite to the first face, the second face having a p-side region and an n-side region;

a nitride semiconductor light emitting layer provided on the p-side region of the second face of the first nitride semiconductor layer;

a second nitride semiconductor layer provided on the nitride semiconductor light emitting layer;

a p-side electrode provided on the second nitride semiconductor layer; and an n-side electrode provided on the n-side region of the second face of the first nitride semiconductor layer, the nitride semiconductor light emitting layer having a first concave-convex face provided on the first nitride semiconductor layer side thereof, and a second concave-convex face provided on the second nitride semiconductor layer side thereof, the first concave-convex face including a plurality of concave portions and a plurality of convex portions, the second concave-convex face including a plurality of concave portions and a plurality of convex portions, wherein the p-side electrode and the n-side electrode are not provided on the first face of the first nitride semiconductor layer, and the first face of the first nitride semiconductor layer opposite to the p-side region and the n-side region is a concave-convex face.

2. The device according to claim 1, wherein the nitride semiconductor light emitting layer has a multiple quantum well configuration.

3. The device according to claim 1, further comprising:

a first insulating film provided on the p-side electrode and the n-side electrode, and having a first opening therein that extends to the p-side electrode and a second opening therein that extends to the n-side electrode;

a p-side interconnection portion provided on the first insulating film, and electrically connected to the p-side electrode through the first opening; and an n-side interconnection portion provided on the first insulating film, and electrically connected to the n-side electrode through the second opening.

4. The device according to claim 3, wherein the first insulating film covers a side face of the first nitride semiconductor layer that extends from the first face of the first nitride semiconductor layer.

5. The device according to claim 3, further comprising a second insulating film provided between the p-side interconnection portion and the n-side interconnection portion.

6. The device according to claim 5, wherein the second insulating film covers a periphery of the p-side interconnection portion and a periphery of the n-side interconnection portion.

7. The device according to claim 3, wherein the p-side interconnection portion includes a p-side interconnection layer provided inside the first opening and on the first insulating film; and a p-side metal pillar provided on the p-side interconnection layer and being thicker than the p-side interconnection layer, and the n-side interconnection portion includes an n-side interconnection layer provided inside the second opening and on the first insulating film; and an n-side metal pillar provided on the n-side interconnection layer and being thicker than the n-side interconnection layer.

8. The device according to claim 1, wherein the first concave-convex face of the nitride semiconductor light emitting layer are provided along the concave-convex face of the first face of the first nitride semiconductor layer so as to conform to the concave-convex face of the first face of the first nitride semiconductor layer.

9. A semiconductor light emitting device comprising:

a first nitride semiconductor layer having a first face and a second face opposite to the first face, the second face having a p-side region and an n-side region;

a nitride semiconductor light emitting layer provided on the p-side region of the second face of the first nitride semiconductor layer;

a second nitride semiconductor layer provided on the nitride semiconductor light emitting layer;

a p-side electrode provided on the second nitride semiconductor layer;

an n-side electrode provided on the n-side region of the second face of the first nitride semiconductor layer; and a phosphor layer provided on a first face side of the first nitride semiconductor layer, the nitride semiconductor light emitting layer having a first concave-convex face provided on the first nitride semiconductor layer side thereof, and a second concave-convex face provided on a second nitride semiconductor layer side thereof, the first concave-convex face including a first plurality of concave portions and a first plurality of convex portions, the second concave-convex face including a second plurality of concave portions and a second plurality of convex portions, wherein the p-side electrode and the n-side electrode are not provided on the first face of the first nitride semiconductor layer, and the first face of the first nitride semiconductor layer has a concave-convex face provided between the phosphor layer and the first nitride semiconductor layer.

* * * * *